US008496790B2

(12) United States Patent  
Wilson et al.

(10) Patent No.: US 8,496,790 B2
(45) Date of Patent: Jul. 30, 2013

(54) ELECTROCHEMICAL PROCESSOR

(75) Inventors: Gregory J. Wilson, Kalispell, MT (US); Paul R. McHugh, Kalispell, MT (US)

(73) Assignee: APPLIED Materials, Inc., Santa Clara, CA (US)

(*) Notice: Subject to any disclaimer, the term of this patent is extended or adjusted under 35 U.S.C. 154(b) by 88 days.

(21) Appl. No.: 13/288,495

(22) Filed: Nov. 3, 2011

(65) Prior Publication Data

US 2012/0292179 A1 Nov. 22, 2012

Related U.S. Application Data

(63) Continuation-in-part of application No. 13/110,728, filed on May 18, 2011.

(51) Int. Cl.
C25D 17/02 (2006.01)
C25D 7/12 (2006.01)

(52) U.S. Cl.
USPC .......... 204/230.2; 204/260; 204/263; 205/96; 205/157

(58) Field of Classification Search
None
See application file for complete search history.

(56) References Cited

U.S. PATENT DOCUMENTS

| | | | |
|---|---|---|---|
| 6,228,232 B1 | 5/2001 | Woodruff et al. | |
| 6,565,729 B2 | 5/2003 | Chen et al. | |
| 6,916,412 B2 | 7/2005 | Woodruff et al. | |
| 6,921,467 B2 | 7/2005 | Hanson et al. | |
| 7,090,751 B2 * | 8/2006 | Hanson | 204/230.3 |
| 7,247,223 B2 | 7/2007 | McHugh et al. | |
| 7,857,958 B2 | 12/2010 | McHugh et al. | |
| 2002/0008037 A1 | 1/2002 | Wilson et al. | |
| 2003/0127337 A1 | 7/2003 | Hanson et al. | |
| 2005/0087439 A1 | 4/2005 | Hanson et al. | |
| 2005/0121326 A1 | 6/2005 | Klocke et al. | |

OTHER PUBLICATIONS

Korean Intellectual Property Office, International Search Report and Written Opinion for PCT/US2012/038435, Jan. 21, 2013.

* cited by examiner

*Primary Examiner* — Harry D Wilkins, III
(74) *Attorney, Agent, or Firm* — Kenneth H. Ohriner; Perkins Coie LLP

(57) ABSTRACT

An electrochemical processor may include a head having a rotor configured to hold a workpiece, with the head moveable to position the rotor in a vessel. Inner and outer anodes are in inner and outer anolyte chambers within the vessel. An upper cup in the vessel, has a curved upper surface and inner and outer catholyte chambers. A current thief is located adjacent to the curved upper surface. Annular slots in the curved upper curved surface connect into passageways, such as tubes, leading into the outer catholyte chamber. Membranes may separate the inner and outer anolyte chambers from the inner and outer catholyte chambers, respectively.

12 Claims, 22 Drawing Sheets

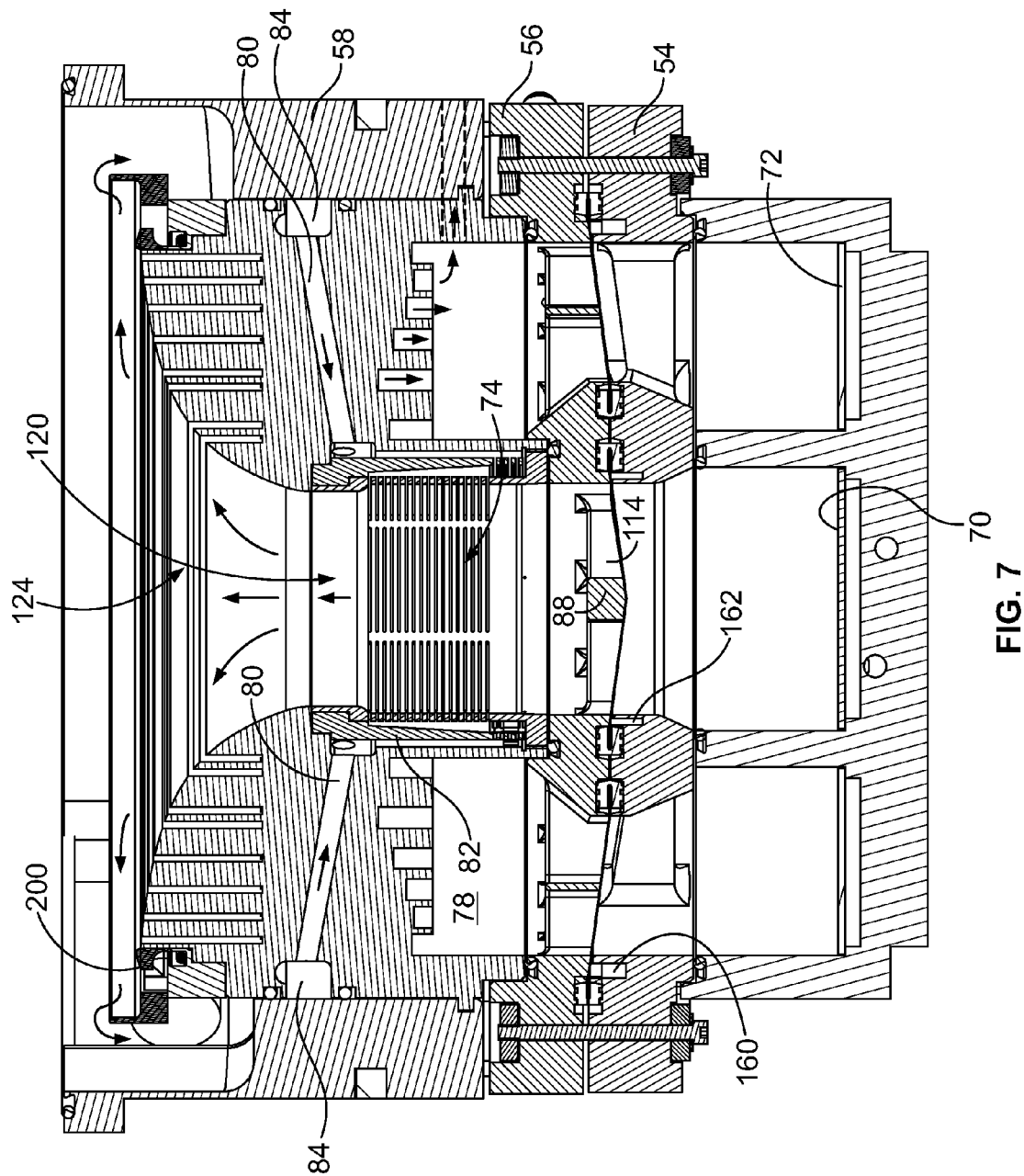

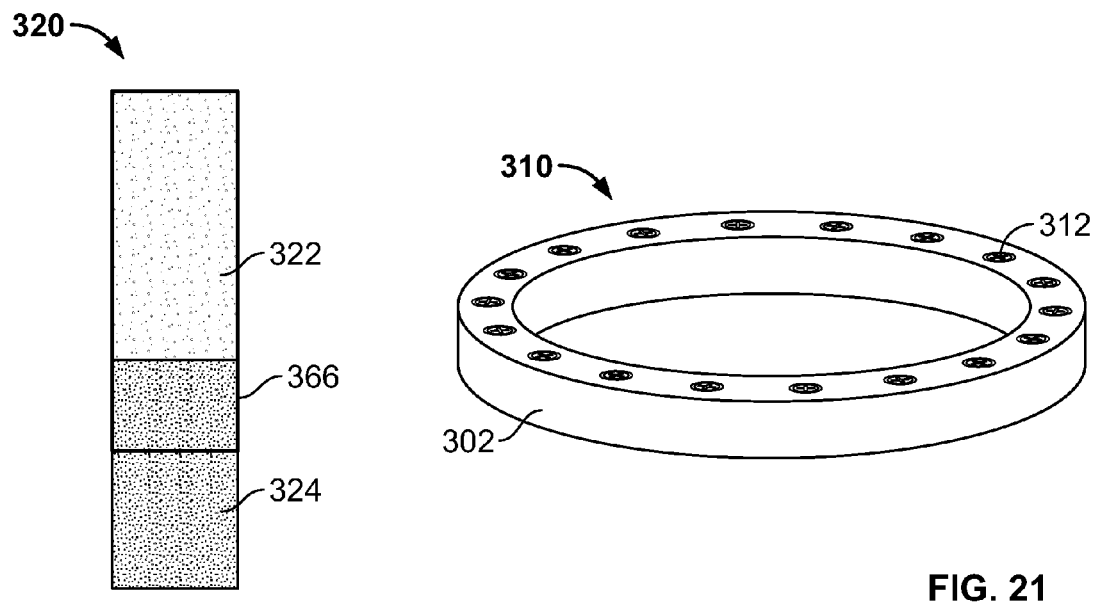
FIG. 20
FIG. 21
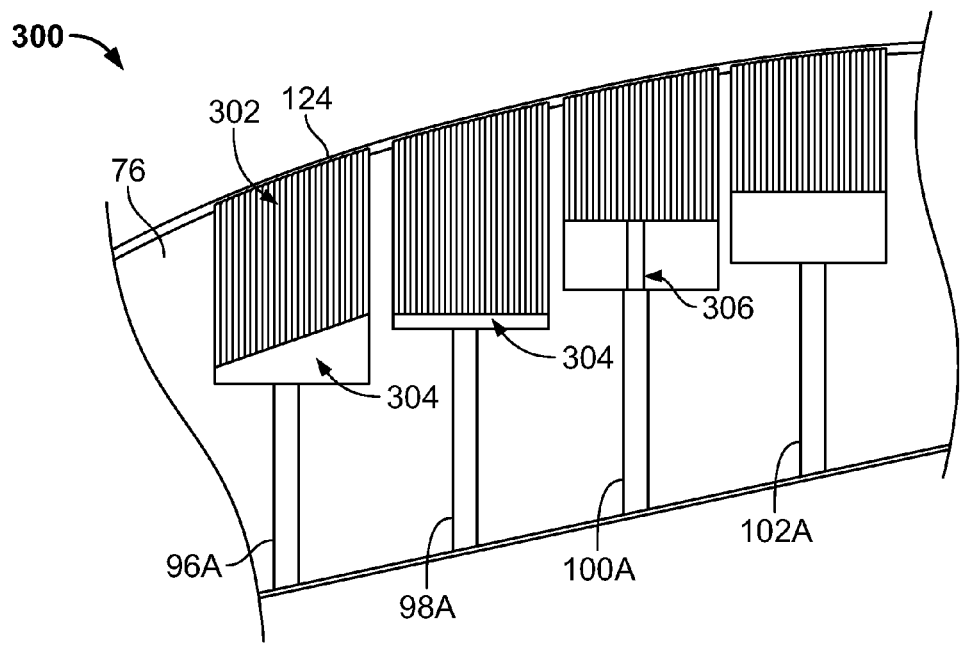
FIG. 22

ELECTROCHEMICAL PROCESSOR

This application is a Continuation-in-Part of U.S. patent application Ser. No. 13/110,728 filed May 18, 2011 and now pending, and incorporated herein by reference.

TECHNICAL FIELD

The field of the invention is chambers, systems, and methods for electrochemically processing microfeature workpieces having a plurality of microdevices integrated in and/or on the workpiece. The micro devices can include submicron features.

BACKGROUND

Microelectronic devices, such as semiconductor devices, imagers, and displays, are generally fabricated on and/or in microelectronic workpieces using several different types of machines. In a typical fabrication process, one or more layers of conductive materials are formed on a workpiece during deposition steps. The workpieces are then typically subject to etching and/or polishing procedures (e.g., planarization) to remove a portion of the deposited conductive layers, to form contacts and/or conductive lines.

Electroplating processors can be used to deposit copper, solder, permalloy, gold, silver, platinum, electrophoretic resist and other materials onto workpieces for forming blanket layers or patterned layers. A typical copper plating process involves depositing a copper seed layer onto the surface of the workpiece using chemical vapor deposition (CVD), physical vapor deposition (PVD), electroless plating processes, or other suitable methods. After forming the seed layer, a blanket layer or patterned layer of copper is plated onto the workpiece by applying an appropriate electrical potential between the seed layer and one or more electrodes in the presence of an electroprocessing solution. The workpiece is then cleaned, etched and/or annealed in subsequent procedures before transferring the workpiece to another processing machine.

As microelectronic features and components are made ever smaller, the thickness of the of the seed layer deposited into or onto them must also be made ever smaller. Electroplating onto thin seed layers presents substantial engineering challenges due to the terminal effect. The terminal effect results due to a large voltage drop across the wafer diameter, caused by the high resistance of the seed layer. If not adequately compensated, the terminal effect causes the electroplated layer to be non-uniform, and it may also cause voids within the features. With very thin seed layers, the sheet resistance at the start of the electroplating process may be as high as, for example 50 Ohm/sq, whereas the final sheet resistance of the electroplated film on the workpiece may be below 0.02 Ohm/sq. With conventional electroplating tools, this three orders of magnitude change in sheet resistance can make it difficult or impossible to consistently provide uniform void-free films on workpieces. Accordingly, improved electroplating tools are needed.

SUMMARY OF THE INVENTION

A new processor has now been invented that can successfully electroplate a highly uniform film onto a workpiece, even where the workpiece has a highly resistive seed layer and/or barrier layer. This new processor may also be designed with only two anodes and thief electrode, reducing the cost and complexity of prior designs, while also improving performance.

In one aspect, a processor may include a head having a rotor configured to hold and make electrical contact with a workpiece, with the head moveable to position the rotor in a vessel. Inner and outer anodes are associated with inner and outer anolyte chambers within the vessel. An upper cup in the vessel, above the outer anode chamber, has a curved upper surface and inner and outer catholyte chambers. A current thief is located adjacent to the curved upper surface. Annular slots in the curved upper curved surface connect into passageways, such as tubes, leading into the outer catholyte chamber. Barriers such as membranes may separate the inner and outer anolyte chambers from the inner and outer catholyte chambers, respectively.

Other and further objects and advantages will appear from the following description and drawings which show examples of how this new processor may be designed, along with methods for processing. The invention resides as well in sub-combinations of the elements described.

BRIEF DESCRIPTION OF THE DRAWINGS

In the drawings, the same element number indicates the same element in each of the views.

FIG. 7 is an enlarged rotated section view of the vessel assembly.

FIG. 20 is a schematic diagram of a design for changing the effective length and resistance of the tubes shown in FIG. 6.

FIG. 21 is a schematic diagram of a ring that be inserted into the lower ends of the tubes or into the slots shown in FIG. 6.

FIG. 22 is an enlarged schematic cross section view of the rings as shown in FIG. 21 installed into the slots shown in FIG. 6.

DETAILED DESCRIPTION OF THE DRAWINGS

Figure 1:
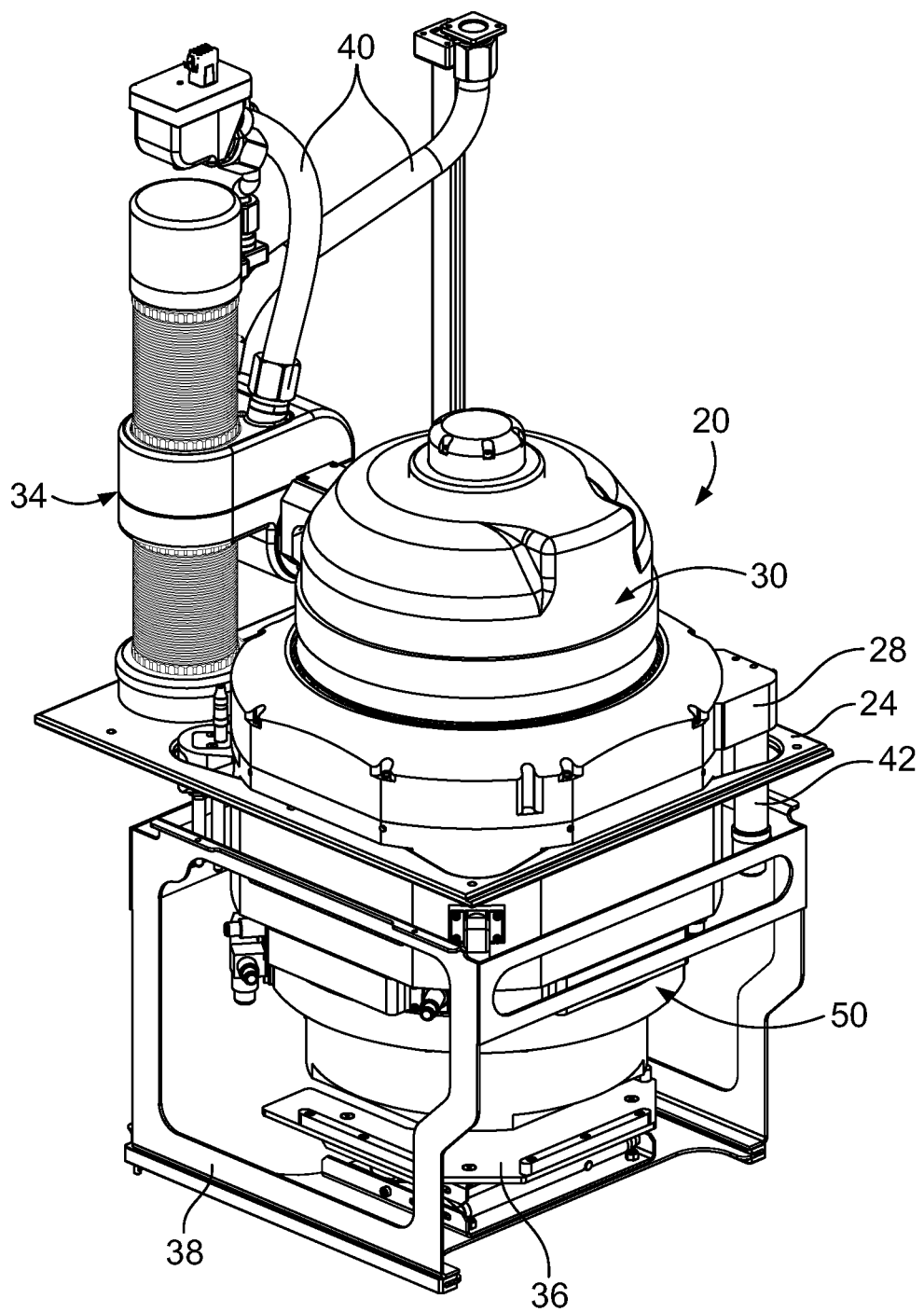
FIG. 1 is a perspective view of a new electro-chemical processor.

Turning now in detail to the drawings, as shown in FIGS. 1-4, an electro-chemical processor 20 has a head positioned above a vessel assembly 50. The vessel assembly 50 may be supported on deck plate 24 and a relief plate 26 attached to a stand 38 or other structure. A single processor 20 may be used as a stand alone unit. Alternatively, multiple processors 20 may be provided in arrays, with workpieces loaded and unloaded in and out of the processors by one or more robots. A head 30 may be supported on a lift/rotate unit 34, for lifting and inverting the head to load and unload a workpiece into the head, and for lowering the head 30 into engagement with the vessel assembly 50 for processing.

Figure 2:
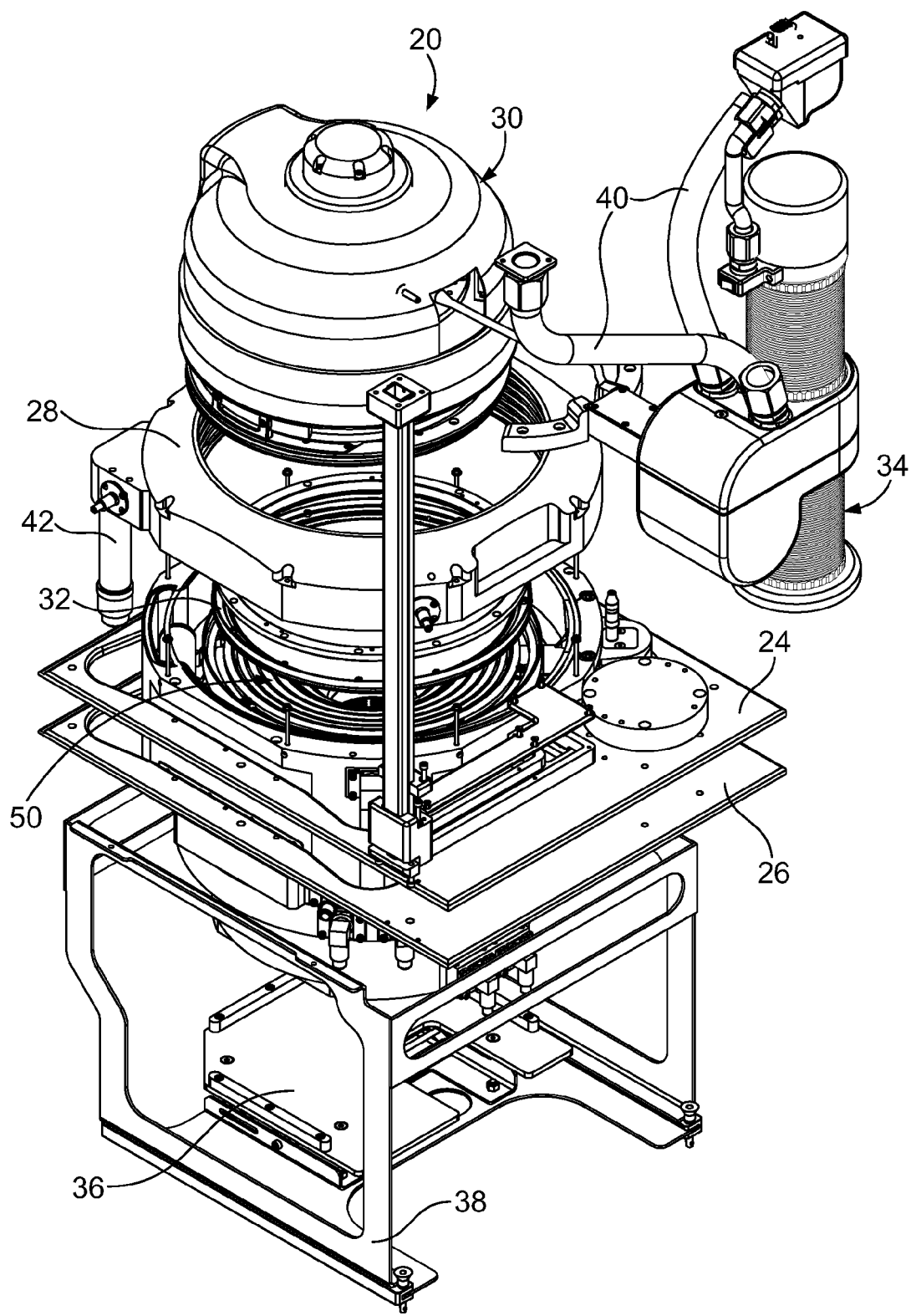
FIG. 2 is an exploded perspective view of the processor shown in FIG. 1.
Figure 3:
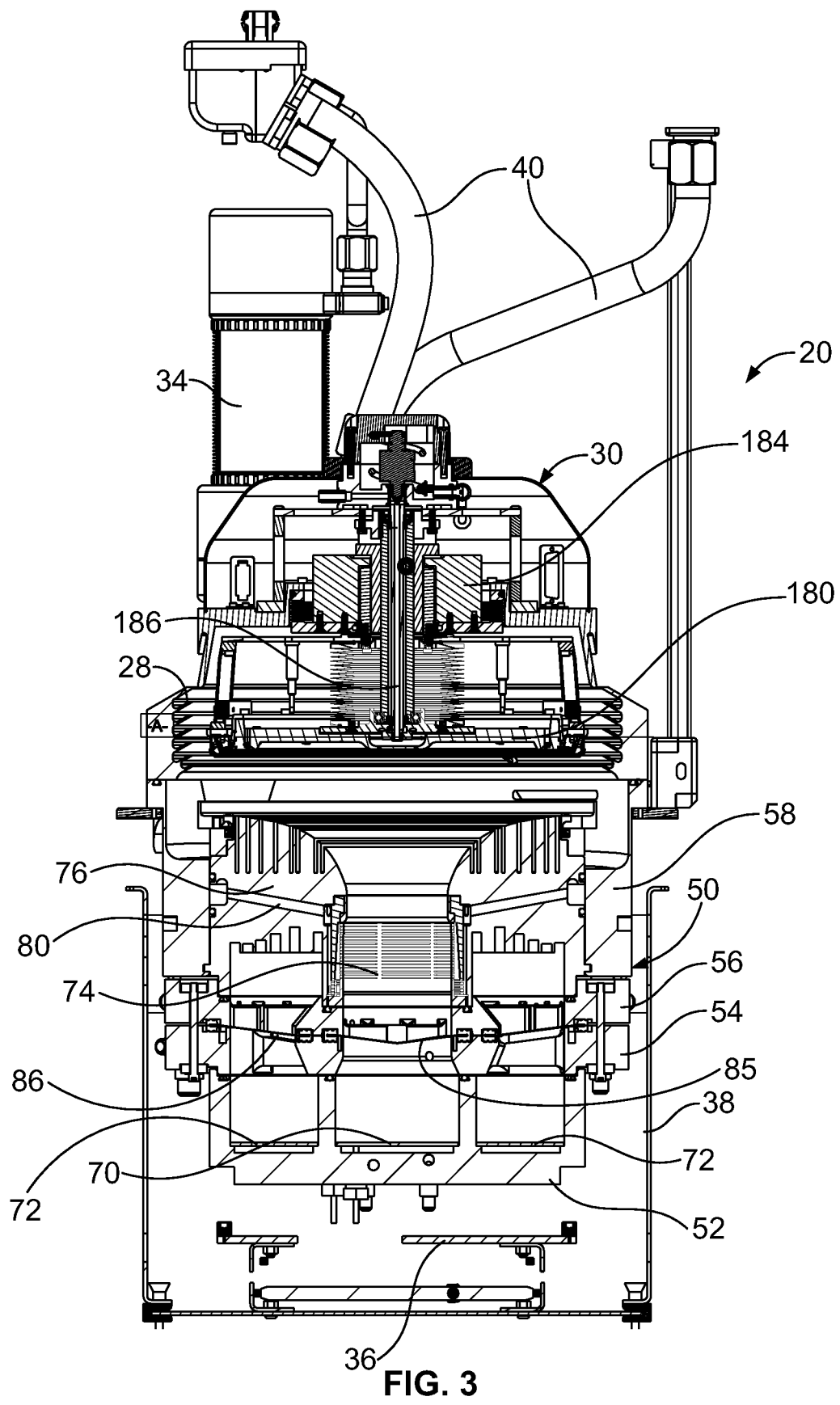
FIG. 3 is a side section view of the processor shown in FIGS. 1 and 2.

As shown in FIGS. 1-3, electrical control and power cables 40 linked to the lift/rotate unit 34 and to internal head components lead up from the processor 20 to facility connections, or to connections within multi-processor automated system. A rinse assembly 28 having tiered drain rings may be provided above the vessel assembly 50. A drain pipe 42 connects the rinse assembly 28, if used, to a facility drain. An optional lifter 36 may be provided underneath the vessel assembly 50, to support the anode cup during changeover of the anodes. Alternatively, the lifter 36 may be used to hold the anode cup up against the rest of the vessel assembly 50.

Figure 4:
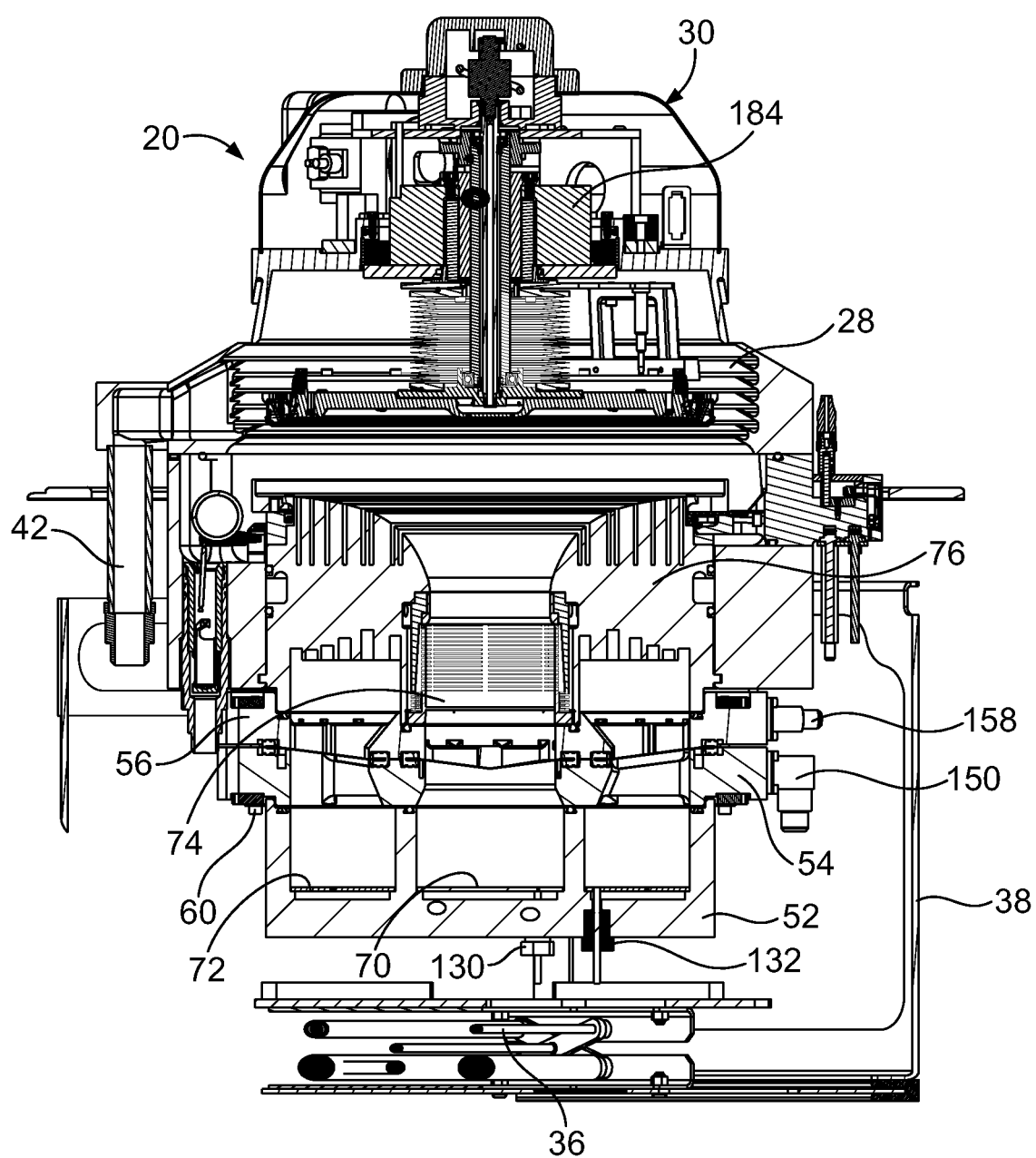
FIG. 4 is a front section view of the processor shown in FIGS. 1 and 2.
Figure 5:
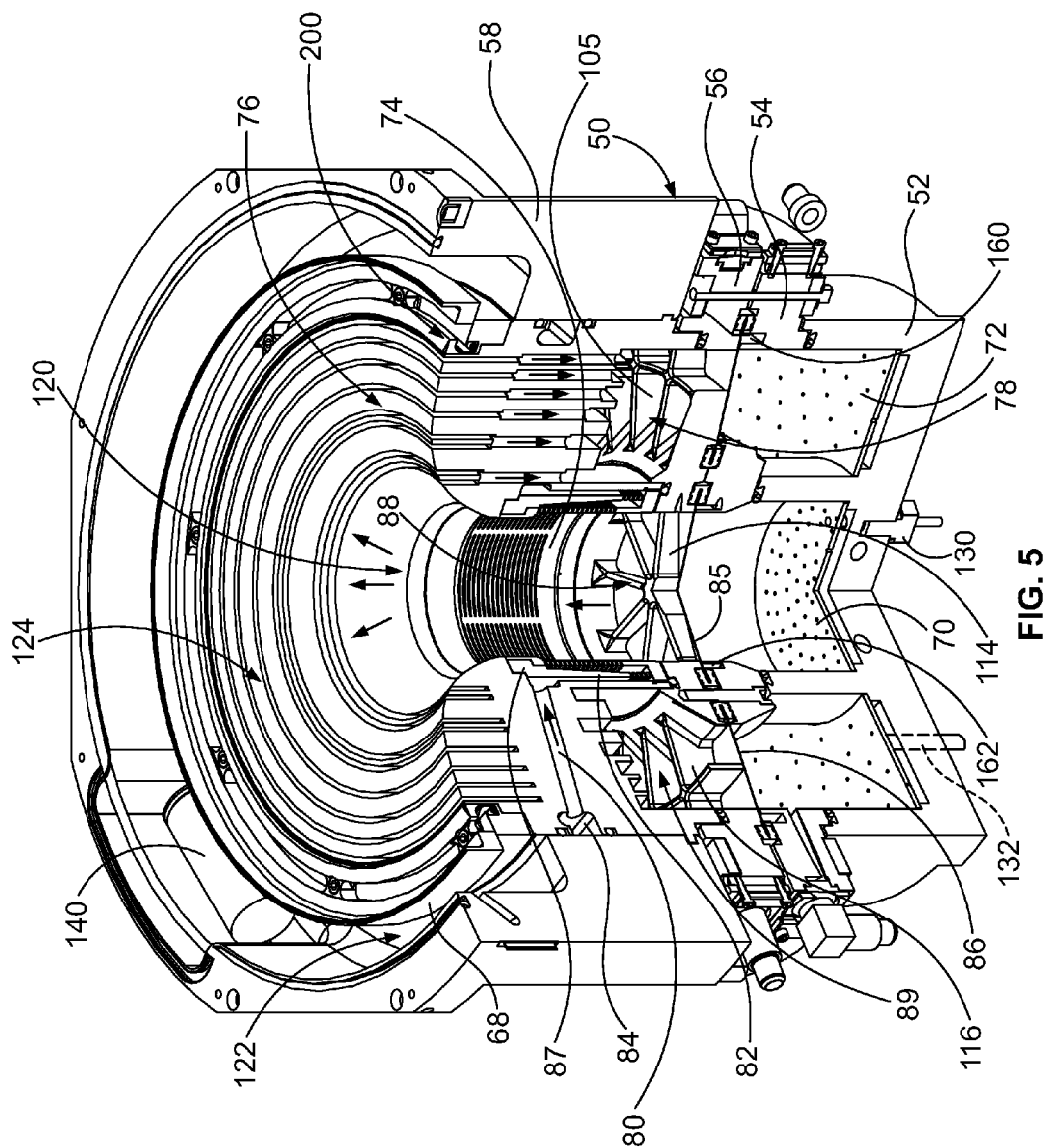
FIG. 5 is a perspective view cross section of the vessel assembly shown in FIGS. 1-4.

Referring now to FIGS. 3-7, the vessel assembly 50 may include an anode cup 52, a lower membrane support 54, and upper membrane support 56 held together with fasteners 60. Within the anode cup 52, a first or inner anode 70 is positioned near the bottom of an inner anolyte chamber 110. A second or outer anode 72 is positioned near the bottom of an outer anolyte chamber 112 surrounding the inner anolyte chamber 110. The inner anode 70 may be a flat round metal plate, and the outer anode 72 may be flat ring-shaped metal plate, for example, a platinum plated titanium plate. The inner and outer anolyte chambers may be filled with copper pellets. As shown in FIG. 5, the inner anode 70 is electrically connected to a first electrical lead or connector 130 and the outer anode 72 is electrically connected to a separate second electrical lead or connector 132. Unlike many earlier known designs, in one embodiment, for example for processing 300 mm diameter wafers, the processor may have a center anode, and only a single outer anode, yet still achieve improved performance due to other design features. Having only two anodes, instead of three or more anodes, simplifies the design and control of the processor, and also reduces the overall cost and complexity of the processor. Designs three or more anodes may also optionally be used, especially with even larger wafers.

Turning now to FIGS. 5-9, an upper cup 76 is contained within or surrounded by an upper cup housing 58. The upper cup housing 58 is attached to and sealed against the upper cup 76. The upper cup 76 has a curved top surface 124 and a central through opening that forms a central or inner catholyte chamber 120. This chamber 120 is defined by the generally cylindrical space within a diffuser 74 leading into the bell or horn shaped space defined by the curved upper surface 124 of the upper cup 76. A series of concentric annular slots extend downwardly from the top curved surface 124 of the upper cup 76. An outer catholyte chamber 78 formed in the bottom of the upper cup 76 is connected to the rings via an array of tubes or other passageways, as further described below with reference to FIGS. 10-12.

Referring still to FIGS. 5-9, the diffuser 74 is positioned within a central opening of the upper cup 76 and is surrounded by a diffuser shroud 82. A first or inner membrane 85 is secured between the upper and lower membrane supports 54 and 56 and separates the inner anolyte chamber 110 from the inner catholyte chamber 120. An inner membrane support 88, which may be provided in the form of radial spokes 114 centrally located on the upper membrane support 56, supports the inner membrane 85 from above. This design leaves the inner catholyte chamber 120 substantially open, to better allow high current flow from the inner anode to the workpiece while plating onto resistive films. The radial spokes may occupy or block less than about 5%, 10%, 15% or 20% of the cross section area of the inner catholyte chamber 120.

Similarly, a second or outer membrane 86 is secured between the upper and lower membrane supports and separates the outer anolyte chamber 112 from the outer catholyte chamber 78. An outer membrane support 89, which may be provided in the form of radial legs 116 on the upper membrane support 56, supports the outer membrane from above.

Figure 6:
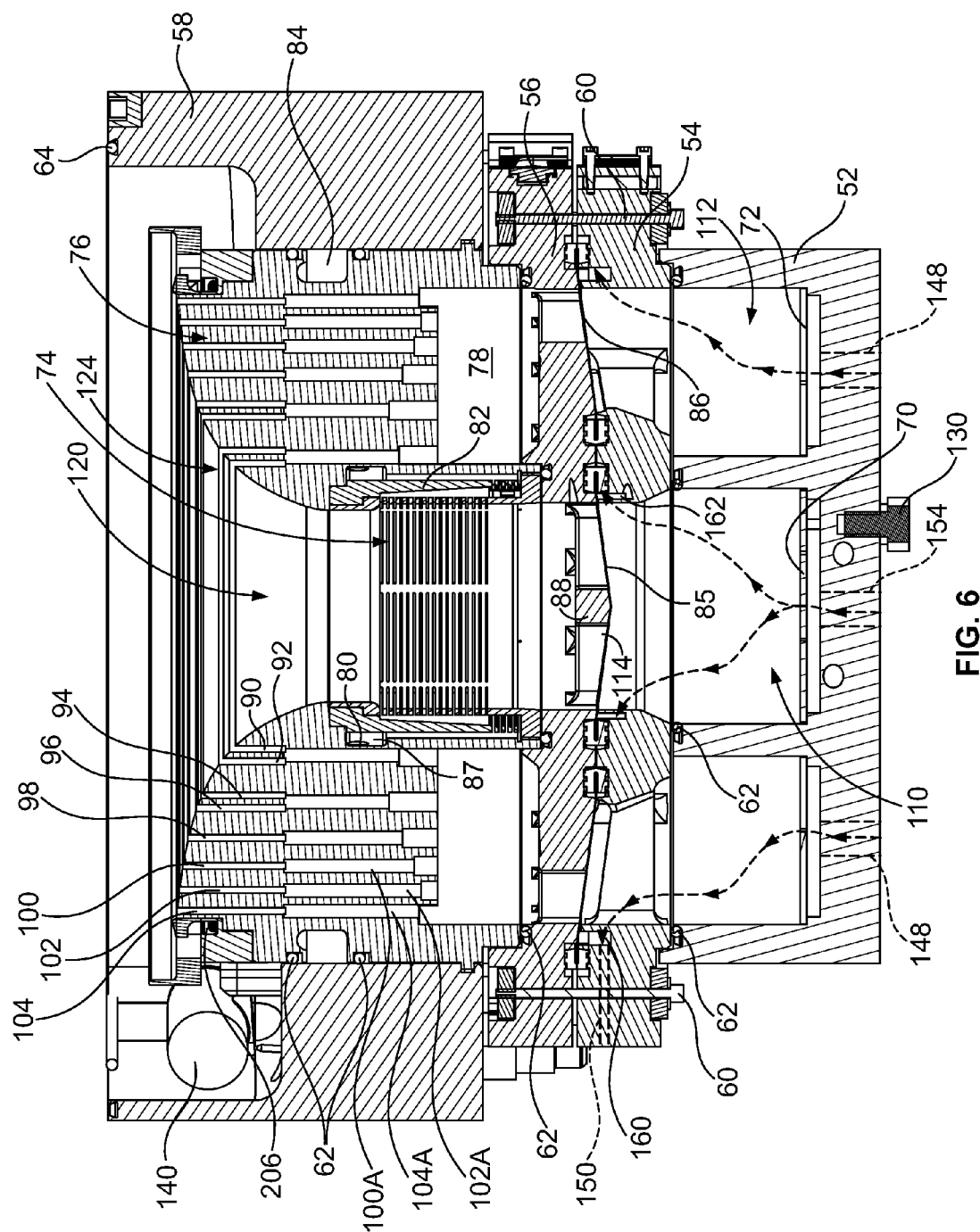
FIG. 6 is an enlarged section view of the vessel assembly.
Figure 8A:
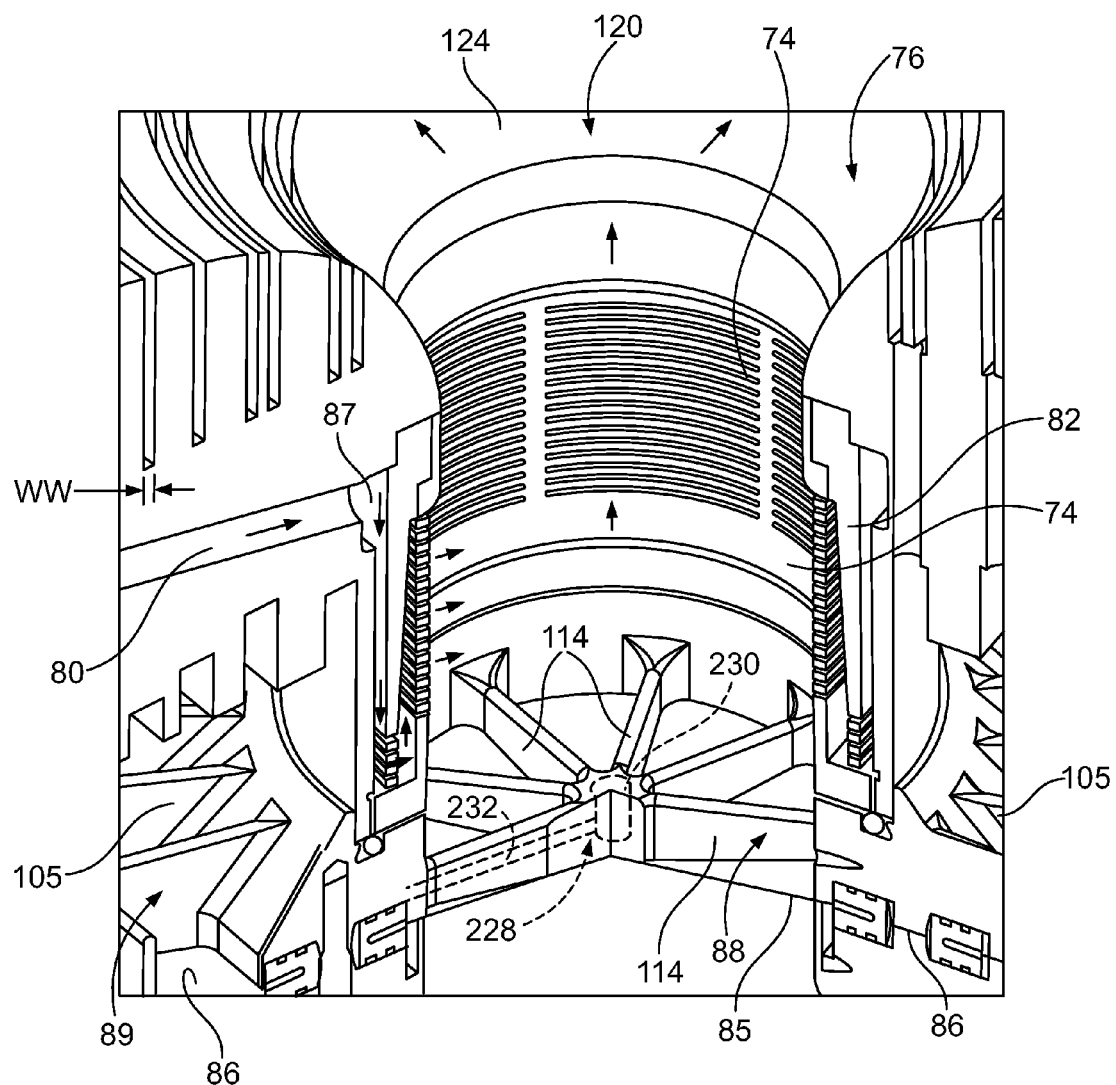
FIG. 8A is an enlarged perspective view of the diffuser shown in FIGS. 6 and 7.

As shown in FIGS. 5-7, a diffuser circumferential horizontal supply duct 84 may be formed in an outer cylindrical wall of the upper cup 76, with the duct 84 sealed by O-rings or similar elements between the outer wall of the upper cup 76 and the inner cylindrical wall of the upper cup housing 58. As shown in FIGS. 5, 7 and 8A, radial supply ducts 80 extend radially inwardly from the circumferential duct 84 to an annular shroud plenum 87 surrounding the upper end of the diffuser shroud 82. The radial ducts 80 pass through the upper cup 76 in between the vertical tubes connecting the annular slots in the curved upper surface 124 of the upper cup 76 to the outer catholyte chamber 78. The section view of FIG. 7 is taken on a plane passing through the radial ducts 80. Consequently, the radial ducts 80 are shown in FIG. 7, while the vertical tubes are not. The section view of FIG. 6 is taken on a plane passing through the vertical tubes. Consequently, the vertical tubes are shown in FIG. 6, while the radial ducts 80 are not.

Figure 13:
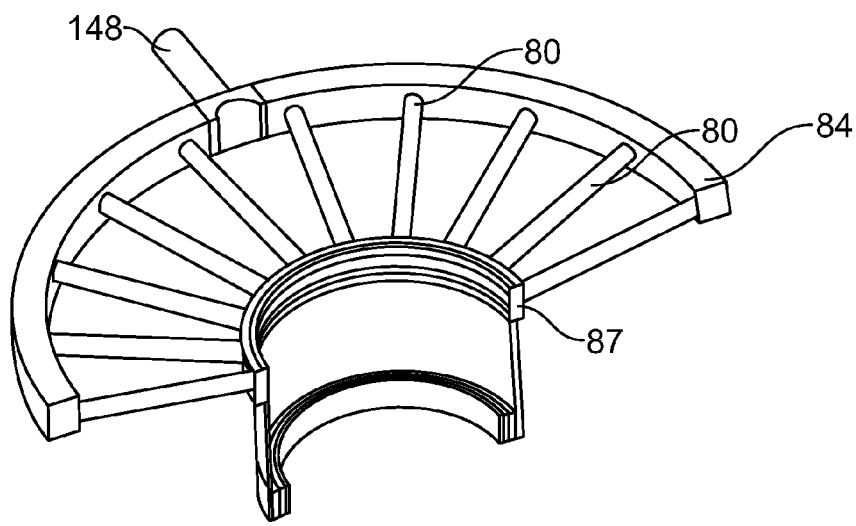
FIG. 13 is another catholyte flow path diagram showing the geometry of the catholyte flow paths into the diffuser.

FIG. 13 shows the circumferential duct 84 and the radial ducts 80 leading to the shroud plenum 87, and the outer catholyte paths formed between the diffuser shroud 82 and the diffuser 74. These outer catholyte paths are ordinarily filled with liquid catholyte during operation of the processor 20. The solid material of the upper cup 76 in which these outer catholyte paths are formed, is not shown in FIG. 13.

Figure 10:
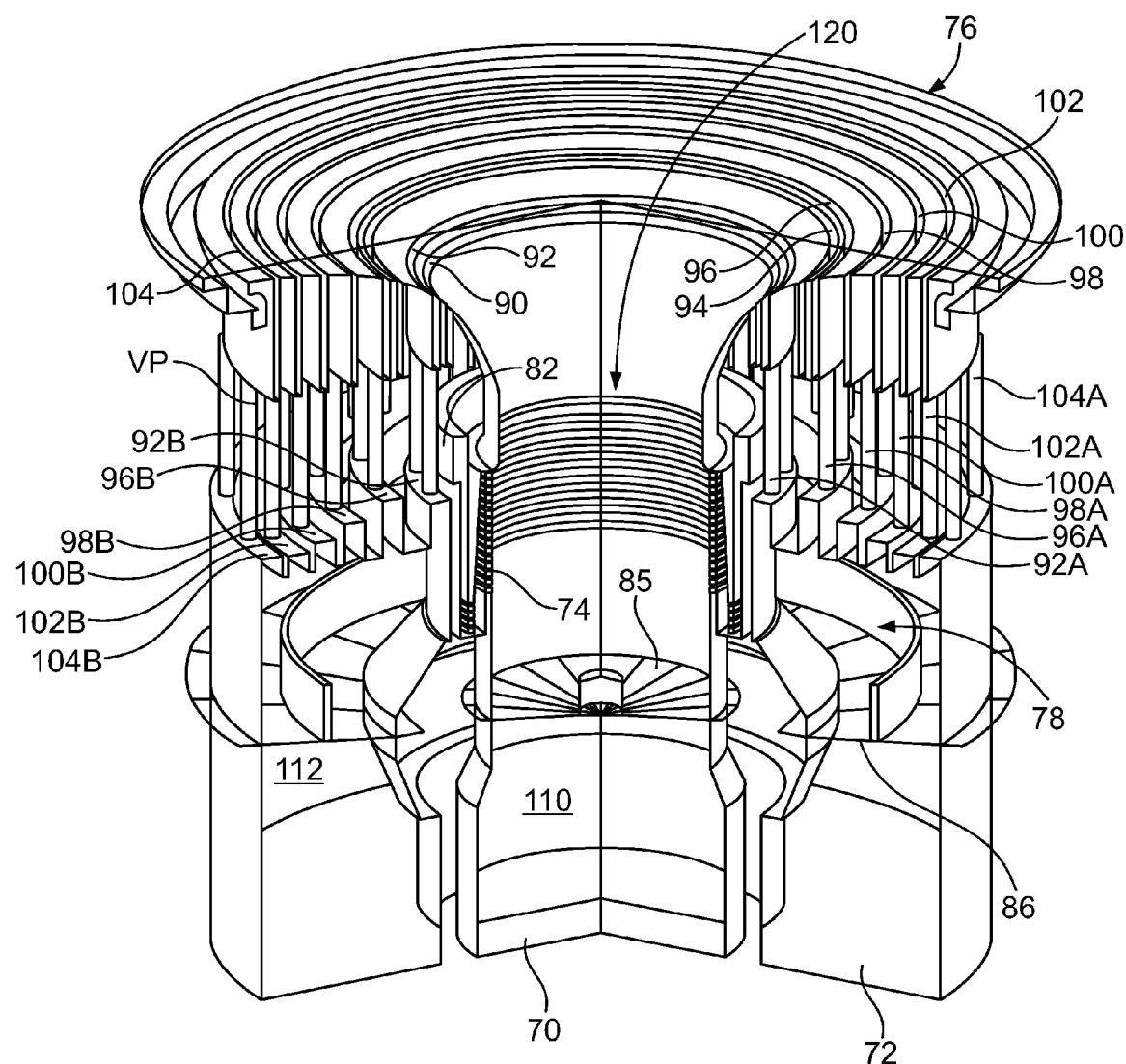
FIG. 10 is a schematic perspective view section of the upper cup shown in FIG. 9.
Figures 10A, 11:
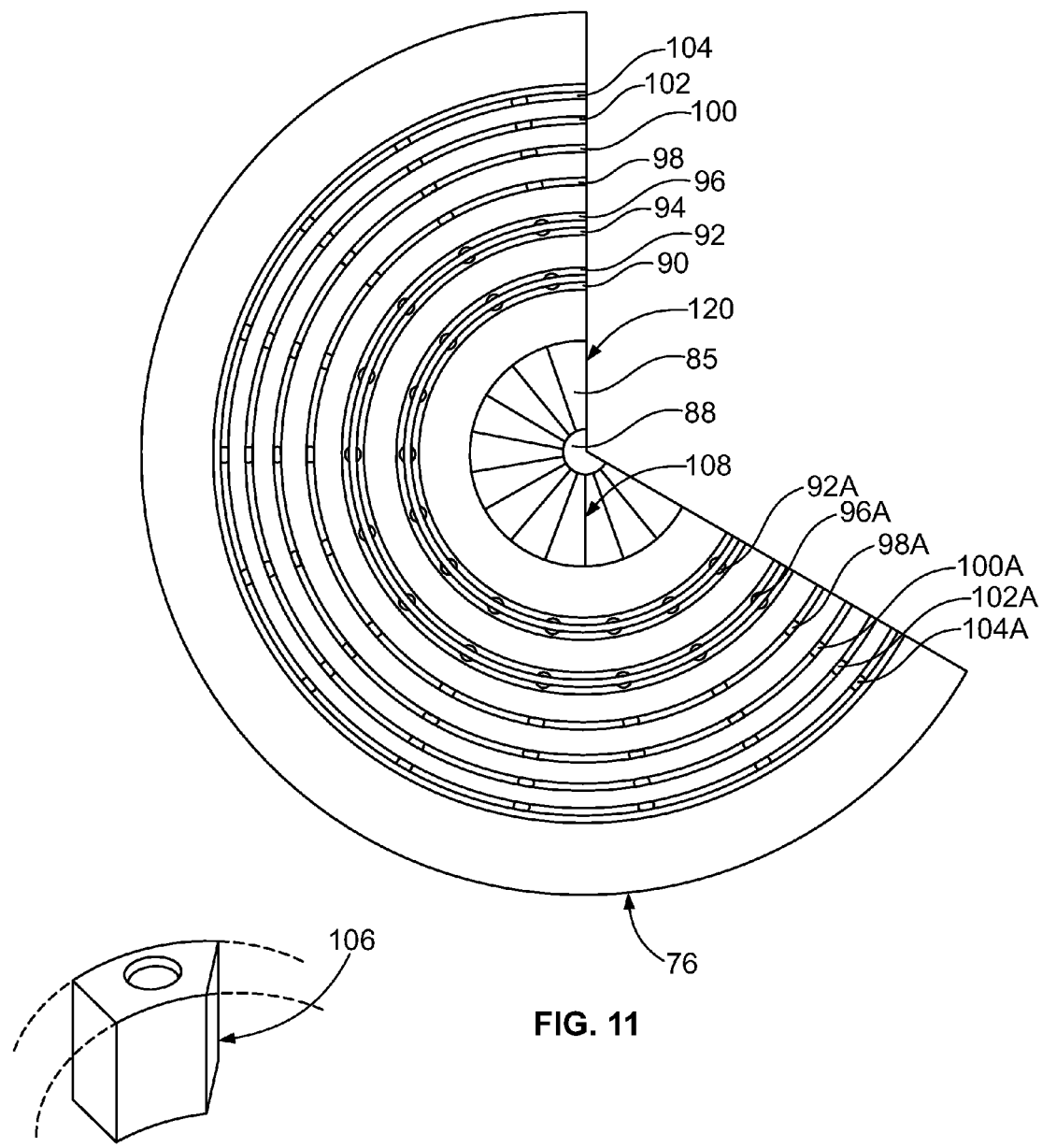
FIG. 10A is a perspective view of an insert for optional use in the processor shown in FIG. 10.
FIG. 11 is a top view of the upper cup shown in FIG. 10.
Figure 12:
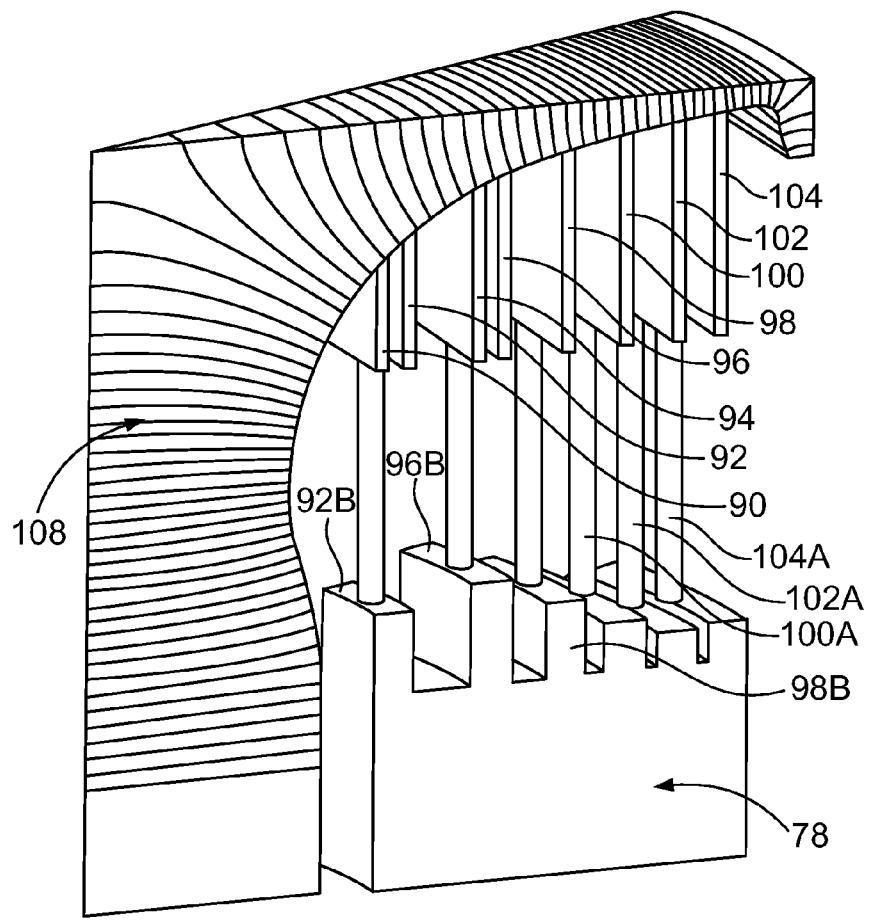
FIG. 12 is a catholyte flow path diagram showing the geometry of the catholyte flow paths in the upper cup shown in FIGS. 10 and 11.

Turning now to FIGS. 10-12, in the example design shown, there are eight circumferential slots or rings extending down from the curved upper surface 124 of the upper cup 76. These are slots 90, 92, 94, 96, 98, 100, 102 and 104. The slots are narrow to provide high electrical resistance. The slots are typically between 1 to 5 mm, or 2-4 mm wide. The narrow width of the slots provides for more continuous curved wall shape. When plating workpieces having high sheet resistance, such as 50 ohm/square, modeling shows that having a high electrical resistance between the anodes and the workpiece, for example greater than 5, 10 or 15 ohms, is helpful in achieving uniform deposition. High electrical resistance reduce current leaks down the inner slots and tubes through the outer catholyte chamber 78 and up the outer tubes and slots to the wafer edge.

In the design shown, the slots are concentric with each other and with inner catholyte chamber 120. The walls of the slots may be straight, with the slots extending vertically straight down from the curved upper surface 124 of the upper cup 76. The number of slots used may vary depending on the diameter of the workpiece and other factors. Generally the slots may extend continuously around the upper cup 76, with no segmenting or interruptions, and no change in profile or width. However, segmented slots may optionally be used, with the segments at shifted radial positions, to reduce radial current density variations. Another option for reducing current density variations is to have the radial position of the slots vary with circumferential angle As shown in FIG. 10, the outer four slots 104, 102, 100 and 98, in the specific example shown, are connected into the outer catholyte chamber 78 by vertical tubes. The tubes connecting the slots 104, 102, 100 and 98 to the outer catholyte chamber 78 are tubes 104A, 102A, 100A and 98A. In the design shown there are 18 tubes connecting into each slot. The tubes generally are straight wall tubes vertical tubes. The tubes may be uniformly circumferentially spaced apart. The number, size (e.g., cross section size diameter), length and shape of the tubes may vary to adjust electrical resistance of the current path through the catholyte in the tubes.

Referring to FIG. 11, in the example shown, the inside diameters of the tubes are greater than the width of the slot that the tube feeds in to. Accordingly, in FIG. 11, the tubes as shown in end view appear more rectangular. A blockage web may also optionally be provided within a slot below the curved upper surface 124 and over the top ends of the tubes, to prevent a direct line-of-sight pathway between the tubes and the slot. The blockage web, if used, forms an intermediate plenum between the tubes and the slot.

Keeping in mind that FIG. 10 shows the open catholyte chambers and pathways, and not the surrounding solid material forming these chambers and pathways, the upper cup 76 may be formed of a di-electric material, such as Teflon (fluoro-polymer) or natural polypropylene, optionally with a two-piece assembly.

In the design shown having 18 tubes (i.e., vertical bores or through holes in the upper cup 76) there is a 20 degree spacing between the tubes. If the number of tubes is reduced, the resistance in each ring of tubes increases significantly, which enables the tubes be made shorter. Although FIG. 11 shows the tubes in each of the rings of tubes as radially aligned, the tubes in any ring of tubes may alternatively be staggered from the tubes in an adjacent ring of tubes.

Electrical current density uniformity at the slot exit is most heavily influenced by the height of the slots and the pitch of the tubes. Aspect ratios of slot height/tube pitch greater than 1.0 generally are predicted to provide good current density uniformity. Tube inside diameters may range from about 3-12 mm or 5-7 mm. A combination of a 2-5 mm slot width and 4-8 mm tube diameter may be used.

In an alternative design, the slots 94-104 (or however many slots are used) have a very narrow width, for example 1 mm, and extend entirely through the upper cup 76, from the curved upper surface 124 of the upper cup 76 to the outer catholyte chamber 78. In this design no tubes are used or needed. Rather, the very narrow slots provide a sufficiently resistive path, without the use of discrete tubes. As forming slots only e.g., 1 mm wide may not necessarily be easily achieved (due to limits on machining or forming techniques), the tubes may be preferred over use of narrow full-length slots. Since the tubes provide discrete spaced apart openings, in comparison to the continuous opening in a slot, rotation of the workpiece may be used with processors using tubes to average out circumferential variations caused by the spaced apart discrete tube openings.

Referring still to FIG. 10, slots 96 and 94 may be closely spaced together with a single set of tubes 96A connecting into both of these slots. Similarly, slots 92 and 90 may be closely spaced together with a single set of tubes 92A connecting into these slots. The length of the tubes is selected to adjust electrical resistance through the catholyte contained by the upper cup 76. As shown in FIG. 10, the top end of each of the tubes, where the tubes join into the slots, may be at the same vertical position VP. However, the vertical position of bottom ends of the tubes may be varied changing the length of the tubes. This may be achieved via steps formed in the bottom surface of the upper cup 76. The steps shown in FIG. 10 are steps 92B, 96B, 98B, 100B, 102B and 104B, with the element number of each of the steps associated with the corresponding element number of the tubes and the slots. For example, the outermost slot 104 is connected to tubes 104A which connect to step 104B. Steps 104B and 102B may be at the same vertical position, with steps 100B, 98B and 96B progressively rising, and with step 92B lower than step 96B, and at about the same vertical position as step 98B.

Flexibility in adapting the slot height and tube spacing (pitch) to a specific process can be advantageous, especially with copper damascene processes, which are sensitive to circumferential variations in current density, even when time-averaged by rotating the workpiece. Use of the steps to independently adjust the lengths of the tubes in each ring of tubes can help improve the radial current density profile. Correspondingly, step inserts 106 or insert rings, such as shown in FIG. 10A, may be provided as replaceable components that can be selected and installed into the processor below the tubes to change the effective length of the tubes. Use of the inserts 106 may be helpful during initial set up or dialing in of the processor, as the inserts will change the relative amount of electrical current passing through each slot when setting up the processor for a particular process.

The effective length of the tubes may alternatively be selected by varying the vertical position of the bottom of each of the slots, with or without using steps of any similar element. FIG. 12 is a perspective similar to FIG. 13 described above in the sense that it shows the outer catholyte spaces of the liquid catholyte through the diffuser and the upper cup 76, rather than the solid material of these elements. For clarity of illustration the outer catholyte spaces in FIG. 12 have the same element numbers as the features or elements that form or define the outer catholyte spaces. Although described in terms of tubes and steps, generally, depending on the manufacturing technique used, the tubes may be formed as holes through the material forming the upper cup 76, and the steps may similarly be formed as rectangular cross section rings formed in the bottom of the upper cup 76.

Figure 10B:
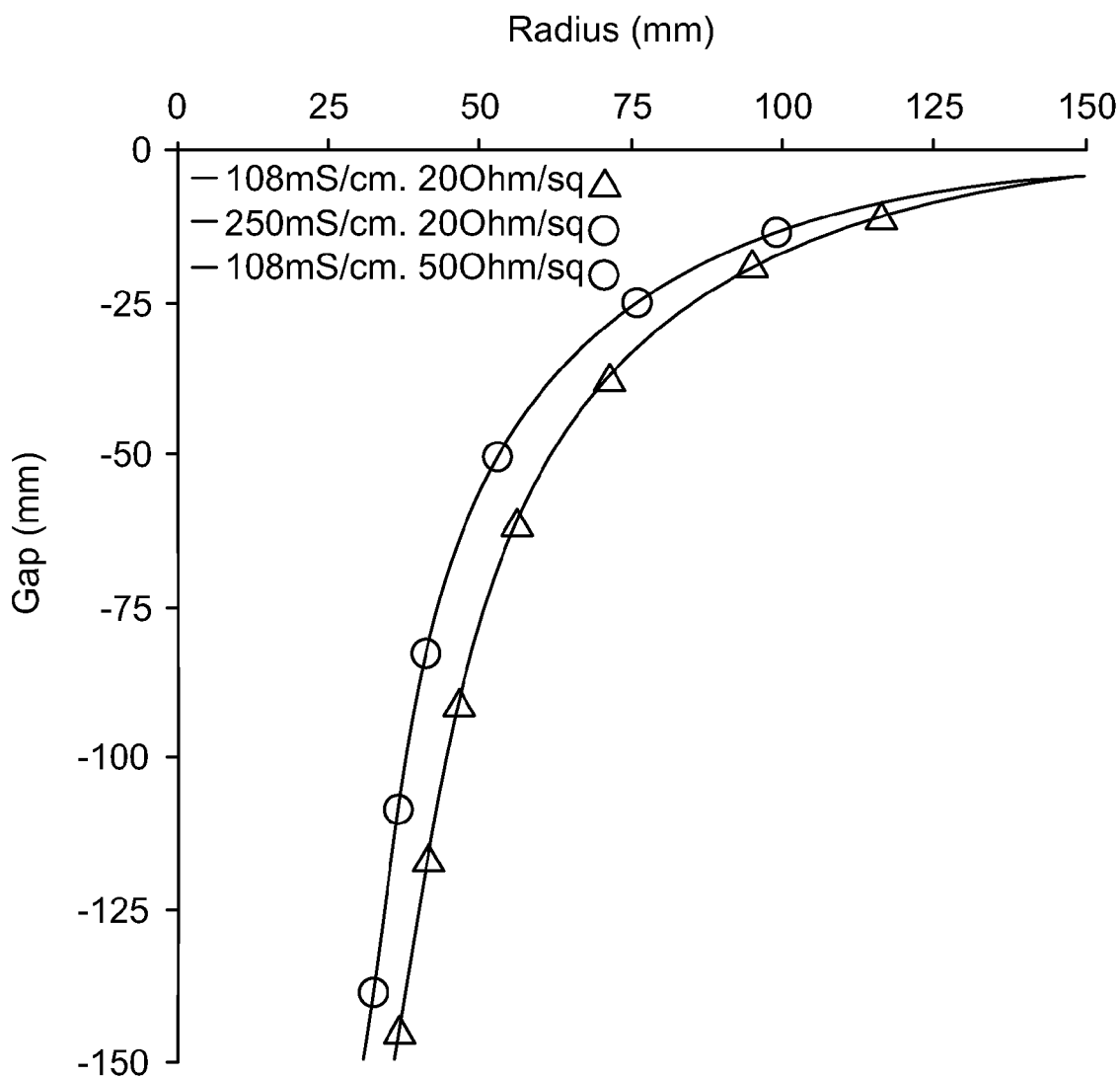
FIG. 10B is a graph of a mathematical model of workpiece-to-surface gap vs. radius of a 300 mm diameter workpiece.

FIG. 10B shows an analytical model of a curvature of the upper surface 124 of the upper cup 76. The curves for a 108 mS/cm, 50 Ohm/Sq and a 250 mS/cm, 20 ohm/sq overlie each other. The lower curve is for a 108 mS/cm, 20 Ohm/sq model. Note that the shape of the curve also depends upon the assumed gap between the wafer edge and the cup. Since the curves drop away from center of the wafer moving outwardly towards the wafer edge to the wafer center, the design of the upper cup 76 is consistent with the flow of catholyte. The two chamber wall curves in FIG. 10B that nearly overlay each other do so because they are for cases that compensate for about the same wafer terminal effect. The terminal effect is proportional to the ratio of the film sheet resistance divided by the bath resistance (i.e. the inverse of the bath conductivity). Therefore, a smaller seed layer sheet resistance using a high conductivity bath (20 Ohms/sq with 250 mS/cm) will yield a similar terminal effect for a higher sheet resistance in a lower bath conductivity (50 Ohms/sq with 108 mS/cm).

The so-called terminal effect causes a higher deposition rate at the edge of the workpiece relative to the center. Accordingly, if not compensated, the terminal effect will result in non-uniform plated films or layers on the workpiece. To better compensate or control the terminal effect, at the outset of plating, the head may hold the workpiece at a first position relatively close to the surface 124 of the upper cup. Then, as film thickness on the workpiece increases and the terminal effect decreases, the head may lift the workpiece to a second position further away from the surface 124, to better avoid uneven deposition resulting from the proximity of the workpiece to the circumferential slots 92-104 in the upper cup. This change in spacing however can result in edge effect deviations in the electric current density around the edges of the workpiece.

Figure 10C:
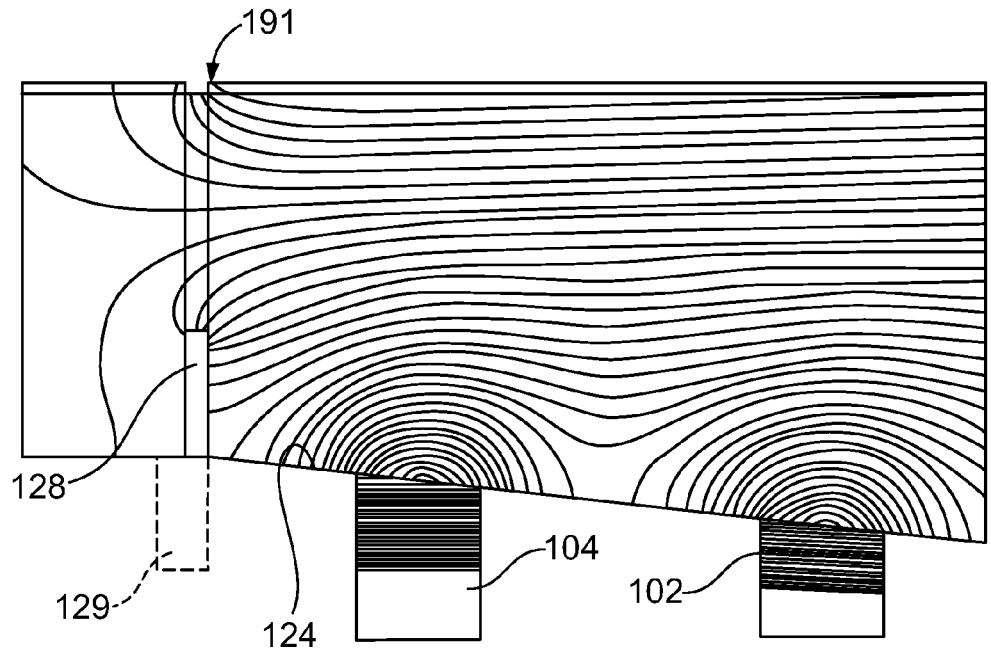
FIG. 10C is a schematic representation of a movable vertical edge shield.

FIG. 10C shows an example of a vertical edge shield 128 that may be used to compensate for these current density variations. The edge of the workpiece is shown at 191. The edge shield 128, typically made of a di-electric material, may drop into an opening below the surface 124 during the initial plating, when the film resistance is high, and then rise up out of the opening, to the position shown in FIG. 10C, as the workpiece is moved away from the surface 124 during later plating. The shield 128 may be moved by an actuator 129.

Figure 10D:
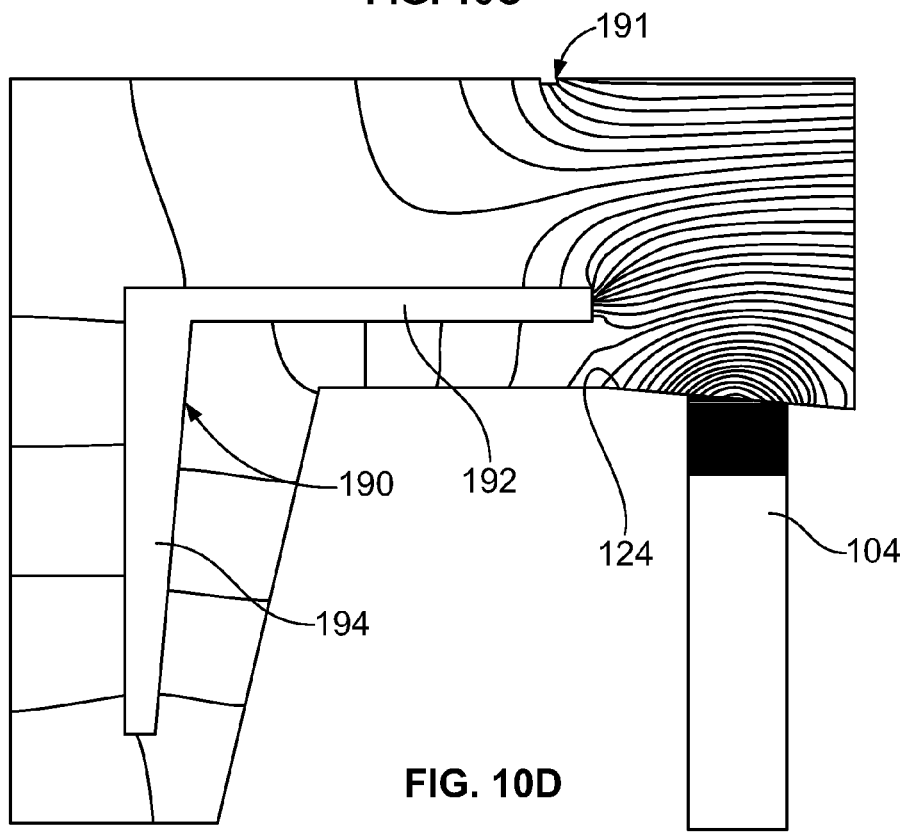
FIG. 10D is a schematic representation of a movable horizontal edge shield

FIG. 10D shows a horizontal edge shield 190 (in white) with the catholyte shown in gray. The workpiece edge is shown at 191. The shield 190 may be formed with a horizontal ring 192 joined to a vertical annular ring 194. Alternatively, the horizontal ring 192 may be used alone and supported on spacers. Alternatively, the horizontal ring 192 may be supported on springs in the upper cup. In this design, as the workpiece is moved up away from the upper cup, the springs lift the shield 190 (or 128) to a raised position. When the workpiece is in the initial lower position closer to the upper cup, the rotor holding the workpiece holds the shield down into a recess in the upper cup. The horizontal ring 192 may be positioned in recess or groove around the perimeter of the upper cup. In comparison to the design in FIG. 10C, in the design in FIG. 10D, the horizontal orientation of the ring 192 allows the thief current to pass over the entire height of the gap between the curved wall and the workpiece, above and below vertical ring 194. The horizontal ring 194 further restricts the current flow path to help adjust the amount of thief current that passes above or below the horizontal ring 192. While the shield 128 in FIG. 10C controls the current crowding to the edge of the wafer, all thief current is also concentrated there to flow above shield 128 to a smaller gap between the top of 128 and the wafer. The enhanced influence on the current thief at the edge of the workpiece in this design may be moderated with changes in other design parameters.

Figure 9:
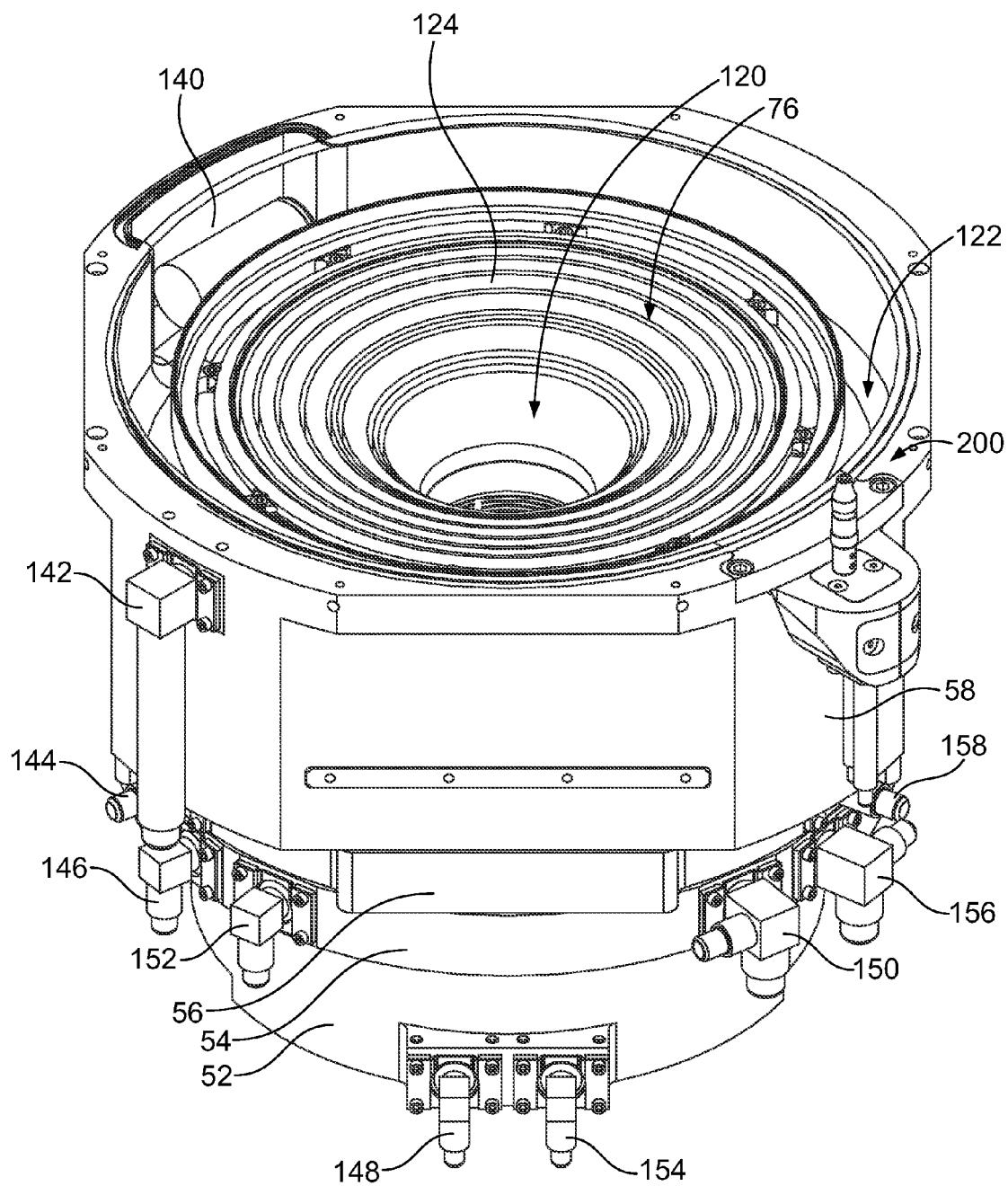
FIG. 9 is a top perspective view of the vessel assembly.

FIG. 9 shows the outside of the processor 20 and the connections or fittings for providing process fluids into and out of the processor 20. Referring to FIGS. 6 and 9, anolyte is provided into the inner anolyte chamber 110 via inlet 154. Anolyte is provided into the outer anolyte chamber 112 via inlet 148. Fitting 146 is an anolyte idle state recirculation port for the outer anolyte chamber 112. Fitting 150 is an outer anolyte chamber 112 return/refresh port. Fitting 156 is an inner anolyte chamber return/refresh port. As shown in FIG. 6, anolyte flows out of the inner anolyte chamber via a circulation slot 162, and anolyte flows out of the outer anolyte chamber via a circulation slot 160. During idle state, when the processor contains anolyte but is not actively processing, outlet 152 allows anolyte to outer catholyte out of the processor. This drops the anolyte level so that the anolyte is not in contact with the membranes, to better avoid diffusion of components of the catholyte and anolyte.

Referring to FIGS. 5 and 9, catholyte flows up and radially outwardly in the inner catholyte chamber 120 and is collected in a collection ring chamber 122. Catholyte flows out of the collection ring chamber 122 to a return port 158 for recirculation. A catholyte level indicator 140 monitors the catholyte liquid leveling the upper cup 76. The terms anolyte and catholyte as used here refer to the location of the electrolyte in the processor, and not necessarily to any specific chemical make up of the electrolyte. The indicator 140 may be connected to a computer controller controlling the processor, or an array of processors in an automated system. A computer controller may also be used to control various other parameters in the operation of the processor 20. Excess catholyte flows out of the processor via a catholyte drain 142 shown in FIG. 9.

As shown in FIGS. 2, 3 and 4, a rotor 180 in the head 30 is rotated by a motor 184. The rotor 180 is adapted to hold a workpiece or wafer. A contact ring on the rotor makes electrical contact with the workpiece. A nozzle 186 may be provided in the head 30 centrally aligned over the workpiece holding position of the rotor 180. Representative rotors 180 are described in U.S. Pat. Nos. 6,527,926, 6,699,373 and 7,118,658, incorporated herein by reference.

Figure 14:
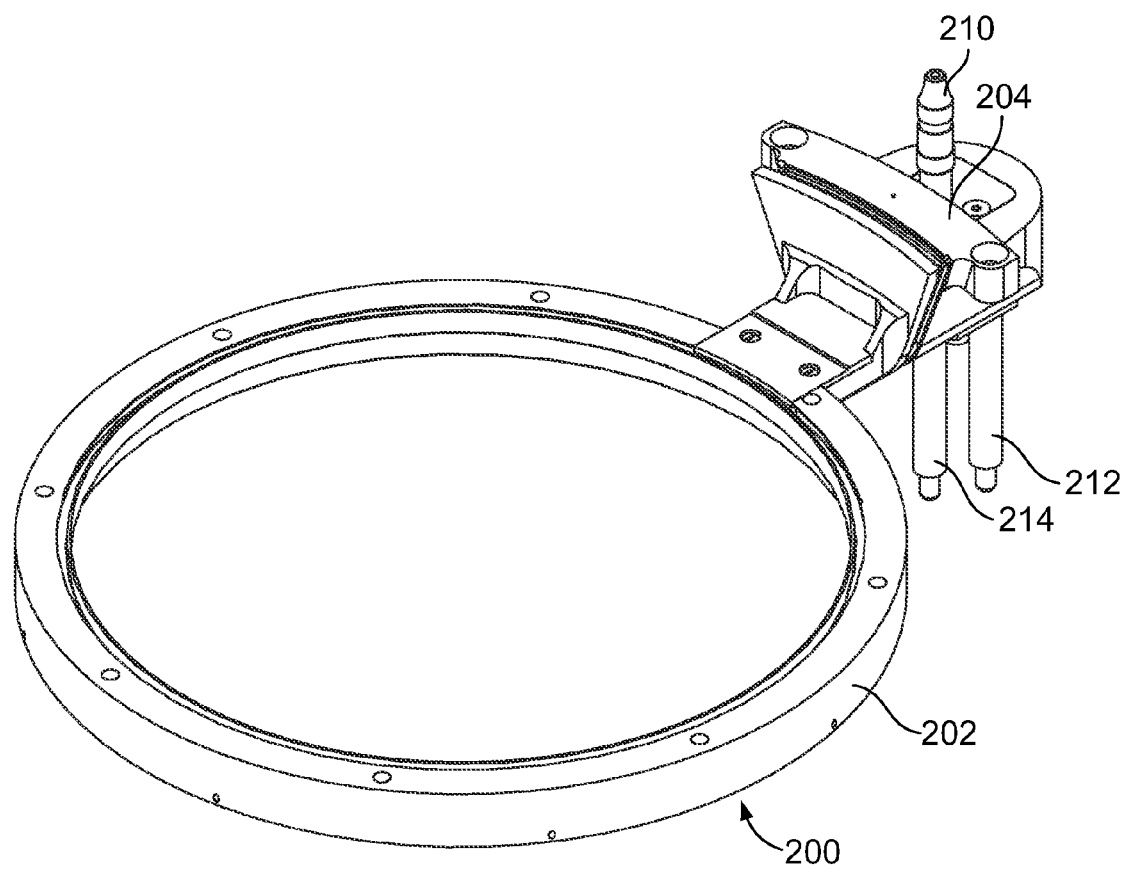
FIG. 14 is a perspective view of a thief ring assembly.
Figure 15:
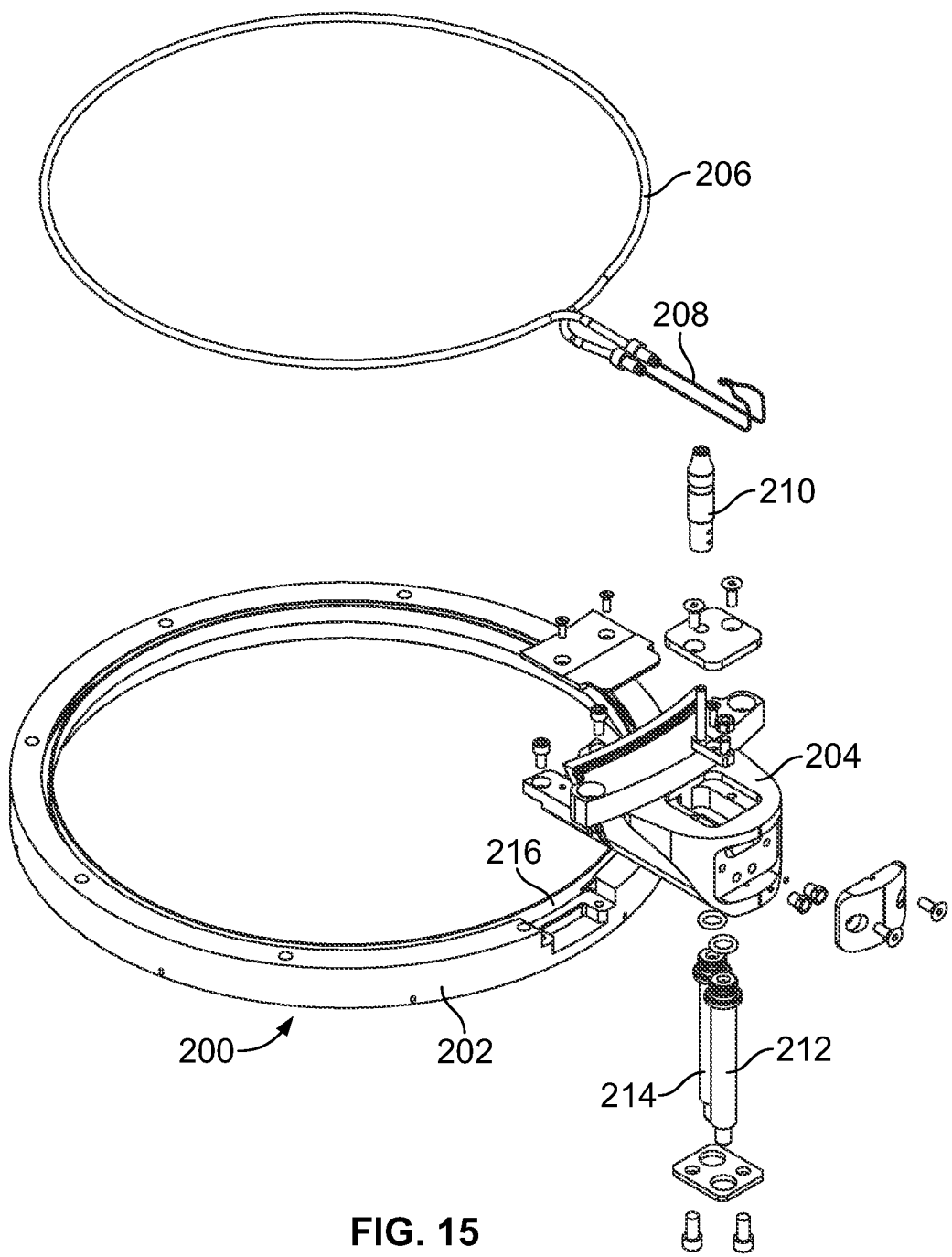
FIG. 15 is an exploded perspective view of the thief ring assembly of FIG. 14.
Figure 16:
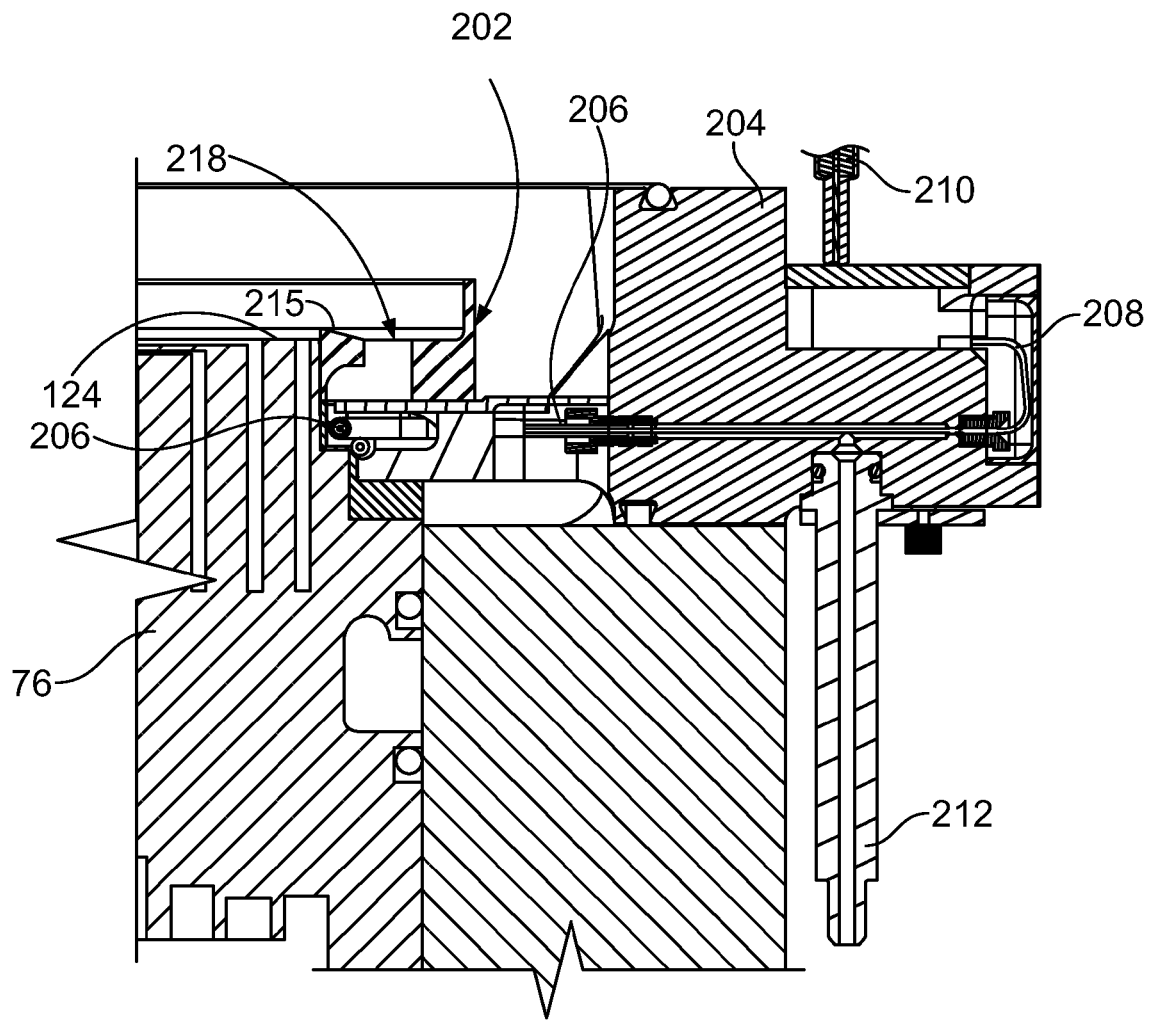
FIG. 16 is a section view of the thief ring assembly of FIGS. 14 and 15 installed on the vessel 50 as shown in FIG. 9.

FIGS. 14, 15 and 16 show a current thief electrode assembly 200 that may be used with the processor 20. The assembly 200 includes a ring 202 attached to a housing 204. A wire 208, such as a platinum wire, extends through a membrane tube 206 positioned within a groove 216 in the ring 202. The ends of the wire 208 terminate within the housing 204 and are connected to a voltage source via a connector 210. Electrolyte is pumped through the membrane tube 206 via an inlet fitting 212 and an outlet fitting 214 attached to the housing 204. The electrolyte liquid provided to the thief assembly 200 ("thiefolyte") may be different from catholyte liquid provided into the upper cup 76. As shown in FIGS. 9 and 16, the assembly 200 fits on top of the upper cup 76 and may be used to change the electrical current flow characteristics of the processor 20. The assembly 200 may be quickly and easily removed from the upper cup 76 and replaced, as a unit. Designs such as described in U.S. Pat. No. 7,727,364, incorporated by reference, may also be used.

In use, a workpiece, typically having an electrically conductive seed layer, is loaded into the head. The seed layer on the workpiece is connected to an electrical supply source, typically to the cathode. If the head is loaded in a face up position, the head is flipped over so that the rotor, and the workpiece held in the rotor, are facing down. The head is then lowered onto the vessel until the workpiece is in contact with the catholyte in the vessel. The spacing between the workpiece and the curved upper surface 124 of the upper cup 76 influences the current density uniformity at the workpiece surface. Generally, the workpiece-to-surface gap (the least dimension between any portion of the curved upper surface 124 and the workpiece) is about 4-14 mm. This gap may be changed during processing. The workpiece may be moved up and away from the surface 124 gradually, or it may be moved quickly from a starting gap to an ending gap. A lift/rotate mechanism such as described in U.S. Pat. No. 6,168,695, incorporated herein by reference, may be used to lift the head.

Anolyte is provided into the inner anolyte chamber 110 and separately into the outer anolyte chamber 112. Catholyte is provided into the circumferential supply duct 84. Thiefolyte is supplied to the inlet fitting 212. The workpiece is moved into contact with the catholyte, typically by lowering the head. Electrical current to the anodes 70 and 72 is switched on with current flowing from the anodes through the anolyte in the inner and outer anolyte chambers 110 and 112. The anolyte itself flows as shown by the dotted arrows in FIG. 6. The electrical current from the inner and outer anodes passes through the anolyte and through the inner and outer membranes 85 and 86, respectively, and into the catholyte contained in the open spaces in the upper cup 76.

Within the upper cup 76, catholyte flows from the supply duct 84 radially inwardly, to the diffuser shroud plenum 87 and then into the diffuser 74 as shown via the arrows in FIG. 8A. The catholyte flows up from the diffuser and moves radially outwardly in all directions over the curved upper surface 124 of the upper cup 76. Metal ions in the catholyte deposit onto the workpiece, building up a metal layer on the workpiece. The motor 184 may be switched on to rotate the rotor 180 and the workpiece, to provide more uniform deposition onto the workpiece. Most of the catholyte then flows into the collection ring 122. A small fraction of the catholyte flows downwardly through the slots 90-104 and the tubes 92A-104A into the outer catholyte chamber 78. The catholyte then flows out of the processor 20.

Generally in electrochemical processors, electrical current tends to flow through all available pathways, resulting in so-called current leaks caused by voltage gradients with the reactor. Current may leak between anode channels through paths such as a membrane or vent holes/slots. Current may also leak along walls of processor components, such as a diffuser. This can cause current density variations at the workpiece surface, resulting in varying deposition rates and ultimately a plated-on metal layer having unacceptable variations in thickness across the workpiece, especially in copper damascene applications. Voltage gradients within the reactor can be particularly large at the beginning and end of plating. When plating on a highly resistive seed layer, current flow is mainly between the inner anode 70 and both the workpiece and the current thief. As a result, the voltage in the inner anode cup and membrane chamber can be quite high (over 100 Volts) while the voltage within the outer anode chamber is low. This large voltage difference can result in significant current leaks, even via relatively small current leak paths. Accordingly, use of separate, individually sealed inner and outer current paths improves the processor performance when plating onto thin seed layers. This includes use of separate individually sealed membranes. The situation can be reversed when plating onto thick, low resistive films when the bulk of the current is from the outer anode. Then, a similarly large, but opposite voltage difference can again exist between the inner and outer anode channels or current paths.

Referring to FIG. 5, the processor may be described as having inner and outer current channels. Using this description, the inner current channel extends generally vertically up from the inner anode 70, through the inner membrane 85, the diffuser 74, and the central catholyte chamber 124 to the workpiece. The inner current channel may be visualized substantially as a cylindrical tube. The outer current channel may correspondingly be visualized as extending vertically up from the outer anode 72, through the outer membrane 86, the outer catholyte chamber 78, and through the openings in the upper cup to the workpiece. The inner and outer current channels are advantageously sealed and isolated from each other by seal elements such as O-rings and walls of dielectric material, to reduce current leakage between them.

The tubes and slots within upper cup 76 are designed to reduce electrical current leakage into and out of the outer anode chamber. In order to plate uniformly on a resistive seed layer, a large radial voltage gradient is necessarily generated within the metal film. The processor must match this radial voltage gradient within the catholyte. So, a large voltage gradient will exist along the surface of the curved chamber wall from the center to the edge (driven by the current between the inner anode and both the wafer and the thief). The voltage at the slots 90, 92, 94, and 96 in the curved chamber wall will be higher voltage than at the slots 98, 100, 102, and 104 which are farther from the center. Therefore, a leakage current flows into the inner slots and then back out of the slots closer to the edge of the wafer. This current path is undesirable leakage because is bypasses the intended current path through the fluid path along the curved chamber wall and decreases the radial current density uniformity across the wafer. To minimize the amount of current though this leakage path, the resistance of the path is made very large by using relatively few and long holes 90A, 92A, 94A, 96A,98A, 100A, 102A, 104A. At the same time, the relative resistance these rows of holes is set, not for current leakage concerns, but to assure the proper radial current distribution from the outer anode 2 to the wafer. The resistance of each row of holes (each radial circle) may be greater than 5 Ohms and more specifically approximately 10 Ohms. The choice of the slot widths is related to the current gradient that exists along the curved when plating on a resistive seed layer. Wide slots distort the curved wall and can be detrimental to the radial current density distribution across the wafer. Wide slots allow the current to dip into and out of a slot as it travels along the wall. However, the slot width is a trade-off because a wider slot is beneficial at the end of plating on a blanket film to avoid deposition bumps that can be produced on the wafer under each slot.

As shown in FIG. 11, the outer slots 100, 102 and 104 may be spaced more closely together than the inner slots 90, 92, 94, 96 and 98. Generally, the closer the slots are to the workpiece, the closer the slots may be together, to better reduce current variations at the workpiece surface.

Electrical potential may also be applied to the thief electrode such as the wire 208, adjacent to the edges of the workpiece, to achieve a more uniform deposition of metal on the workpiece. As shown in FIG. 16, the wire 208 of the thief assembly 200 is positioned within the membrane tube 206 at or near the bottom of the groove 216. The open top 218 of the groove 216 acts as a virtual electrode, as described for example in U.S. Pat. No. 7,842,173 B2, incorporated herein by reference. As the terminal effect decreases as the electroplating process proceeds and the sheet resistance of the workpiece drops, the thief current may also be reduced.

The rotor 180 may use a sealed contact ring or it may use a wet or unsealed contact ring. If a sealed contact ring is used, the seal generally distorts the electric field near the edge of the workpiece. However, this distortion may be compensated, at least in part, via the design of the upper cup 76. The outer perimeter of curved upper surface 124 of the upper cup 76 beyond the outermost slot (slot 104 in the design shown) may be designed to rise up to the seal. This upwardly extending outer area of the upper surface 124 of the upper cup 76 may be curved or flat. The upwardly rising outer perimeter of the upper cup 76 forces the thief current to pass through a narrow gap close to the seal.

The electric field distortion associated with use of a sealed contact ring may also be reduced via the design of the ring 202 of the thief assembly 200. As shown in FIG. 16, the inner edge 215 of the ring 202 provides a step up from outer edge of the top surface 124 of the upper cup. The step height may be about 2-6 mm. The ring 202 may be quickly and easily installed or removed since it is part of the modular thief electrode assembly 200. The processor 20 may be provided with a single upper cup fixed in place, with the ring 202 of the thief assembly selected based on whether a sealed or unsealed contact ring is used.

A method for electrochemically processing a wafer or workpiece includes holding the workpiece in a head, with the head lowering the workpiece into contact with catholyte in a vessel. Electrical current is supplied to an inner anode associated with an inner anolyte chamber within the vessel, and to an outer anode surrounding the inner anode, the outer anode associated with outer anolyte chamber. Electrical current flows through catholyte in annular slots in an upper curved surface of an upper cup in the vessel. Electrical current also flows from a current thief adjacent to upper curved surface of the upper cup. Catholyte flows upwardly towards the workpiece from an inner catholyte chamber separated from the inner anolyte chamber via a membrane. Catholyte may also flow downwardly through the slots into an outer catholyte chamber.

The workpiece may optionally be rotated. The workpiece may also be lifted up and away from the upper curved surface of the upper cup during processing, with the lifting rate a function of the film sheet resistance on the workpiece. The electrical resistance in the current path between the anodes and the workpiece may be greater than 5, 10 or 15 ohms.

For some applications, especially with large diameter workpieces, the processor 20 may be modified to include more than one outer anode.

As shown in dotted lines in FIG. 8A, a center catholyte jet 228 may be provided to increase the mass transfer rate at the central area of the workpiece. The catholyte jet 228 may be formed by a center jet opening 230 in the inner membrane support 88. A duct 232 in one or more of the spokes 114 of the inner membrane support may supply catholyte to the center jet opening 230.

Figure 8B:
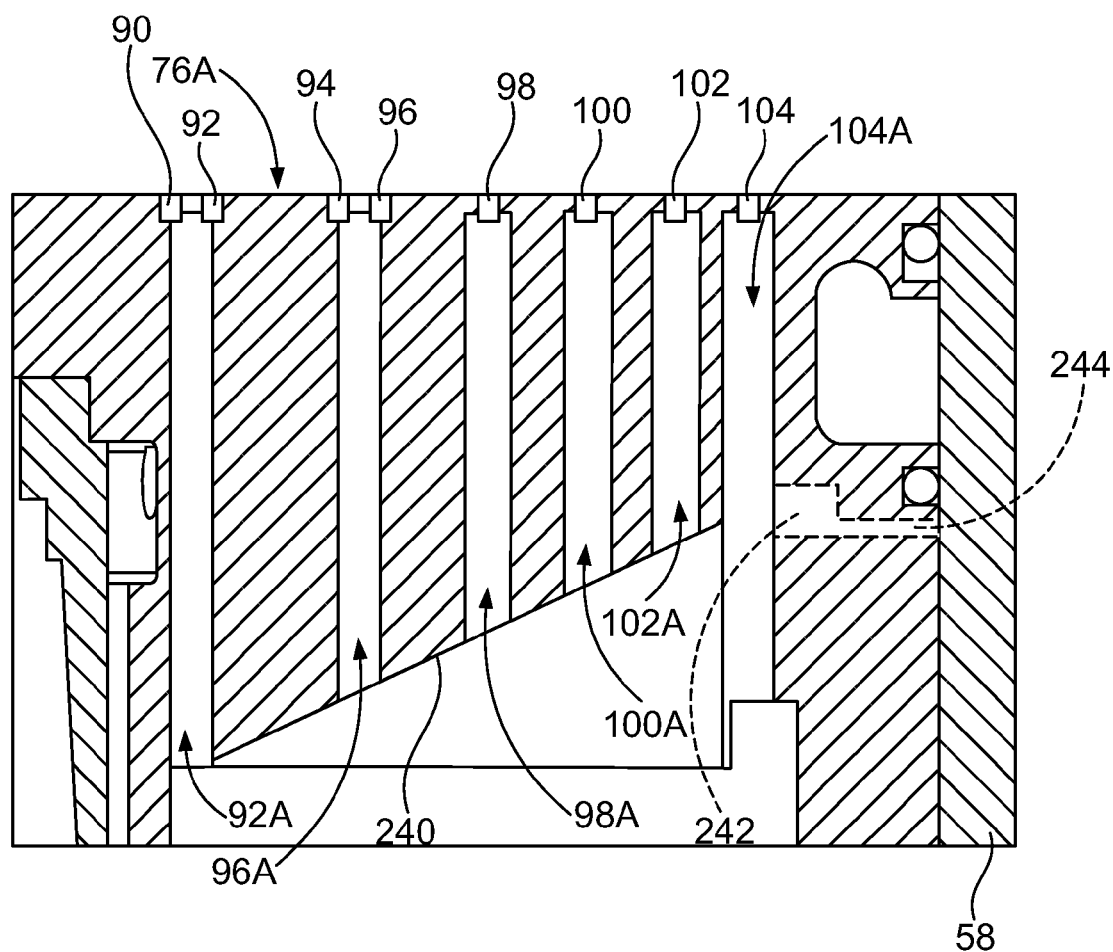
FIG. 8B is an enlarged section view of an alternative the upper cup shown in FIGS. 5 and 6.

As shown in FIG. 8B, in an alternative upper cup 76A, the top surfaces 240 of the outer catholyte chamber 78 are slanted up towards the outer wall. In comparison to the flat or horizontal surfaces shown in FIGS. 5 and 6, the design in FIG. 8B is less prone to trap air bubbles in the catholyte. The inclined surfaces 240 in FIG. 8B tend to convey any bubbles in the catholyte chamber up and radially out towards a recess 242 and a vent 244. The lower openings of the tubes are at different vertical positions. The tube diameters and the slot lengths may be adjusted to achieve appropriate electrical resistance.

Figure 8C:
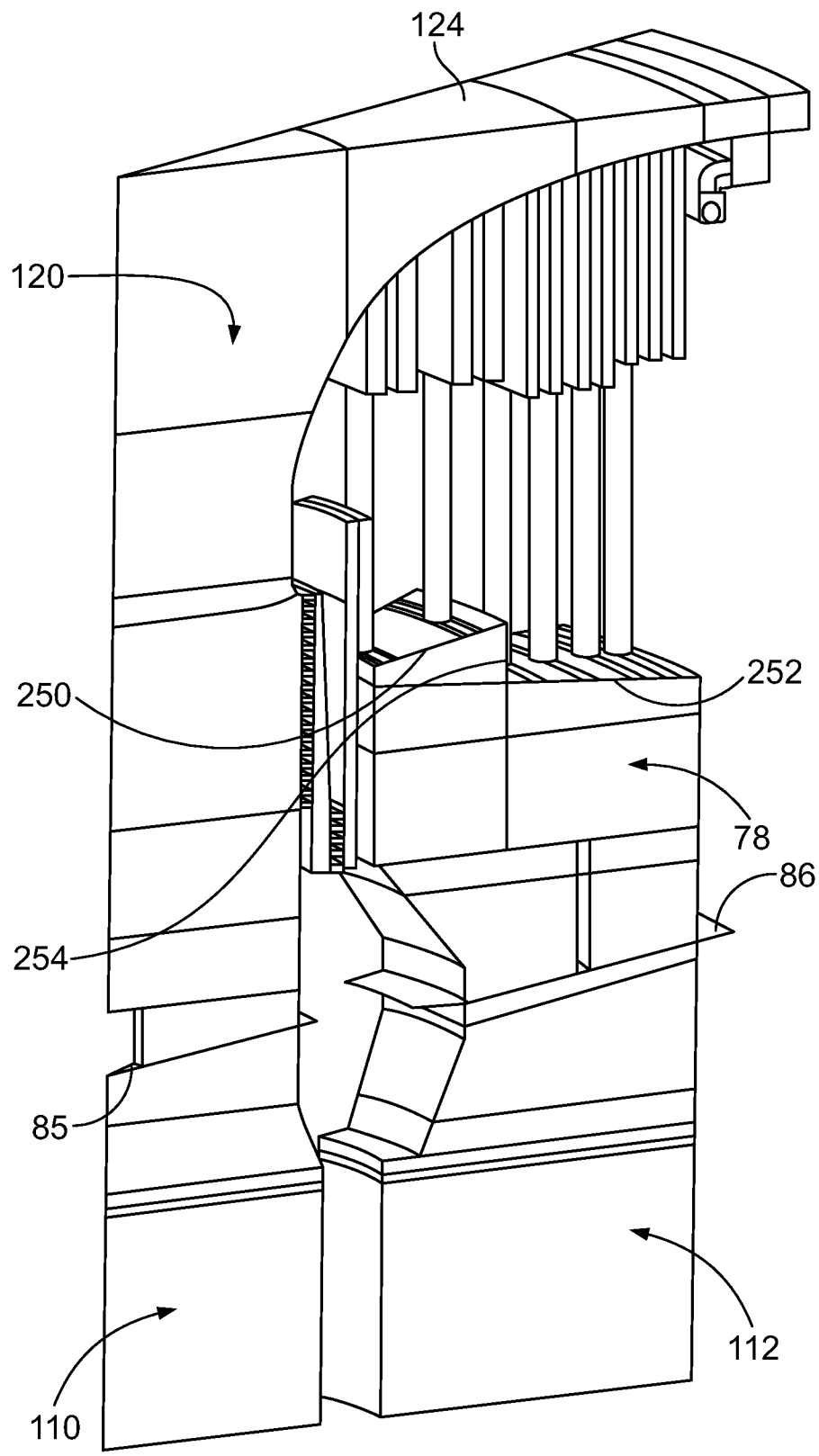
FIG. 8C is an enlarged section view of another alternative upper cup.

As shown in FIG. 8C, in another alternative upper cup design, each tube extending up from the outer catholyte chamber 78 transitions into two slots opening in the curved upper surface 124 of the upper cup. The upper cup in this design has 12 slots. Also as shown in FIG. 8C, the inner top surface 250 of the outer catholyte chamber slopes upwardly, and the outer top surface 252 slopes downwardly (moving radially outwardly), with an abrupt step down 254 between them. This alternative design of the top surfaces of the outer catholyte chamber may also optionally be used to reduce or avoid trapping air bubbles.

Figure 17:
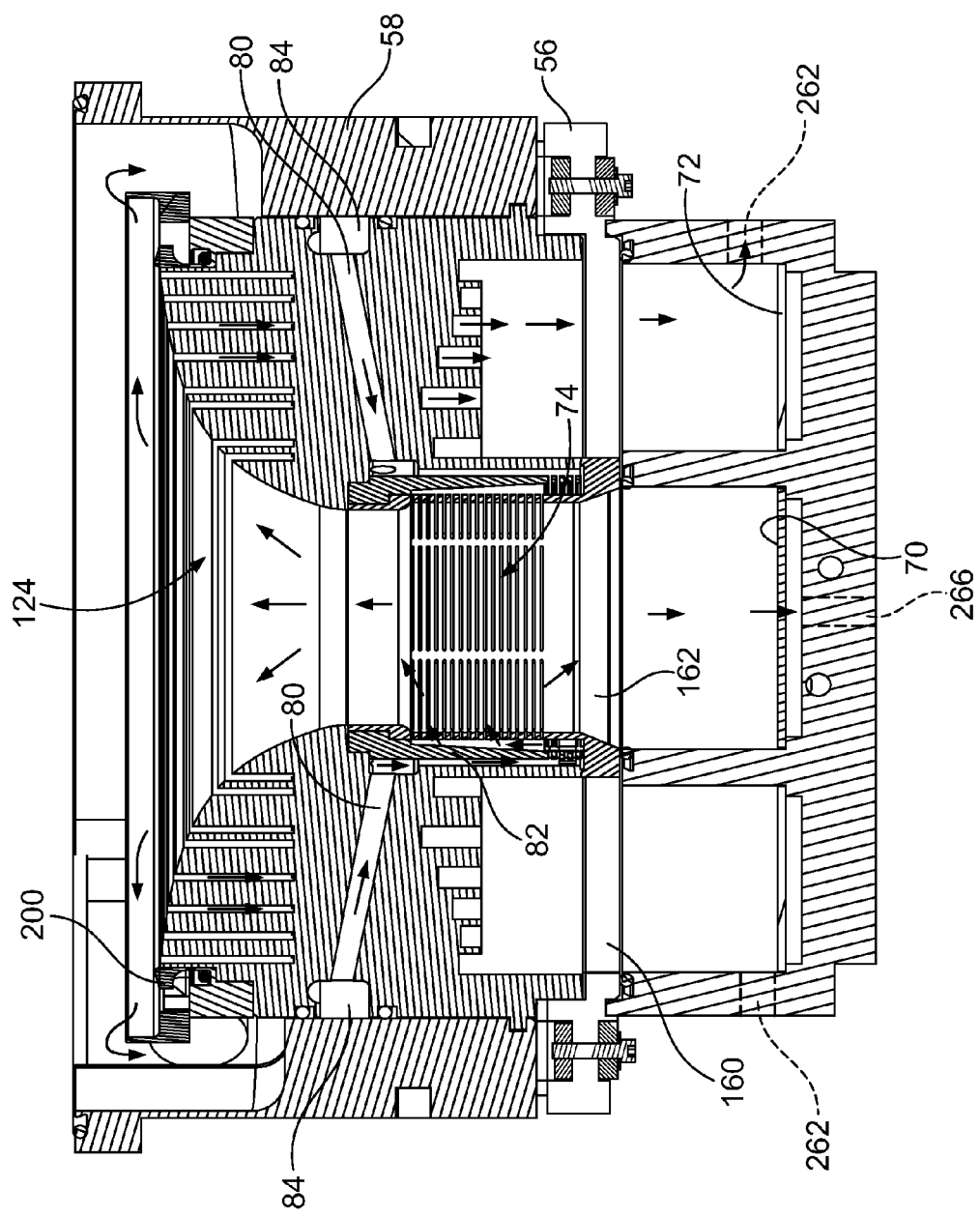
FIG. 17 is a section view of an alternative design using a single electrolyte.

FIG. 17 shows an alternative processor 260 similar to the processor 20 shown in FIGS. 1-7 but using a single electrolyte. The processor 260 has no membranes or other barrier separating lower and upper chambers. Rather, the inner and outer flow channels extend up from the anodes through the upper cup. Electrolyte enters via the supply duct 84 (and with the inner channel filled with electrolyte), flows up and radially outwardly, and over the weir, with a small fraction of the electrolyte flowing down through the slots and tubes (similar to the catholyte in the processor 20). However, since there are no separate upper and lower chambers, the electrolyte flowing down through the tubes flows into the anode compartments, and then out of the processor 260 via outlets 262 and 266. Since the processor 260 has no membranes, no membrane supports are needed.

The processor 20 can plate with uniform current density onto a semiconductor or other work piece over a broad range of metal film sheet resistances, including very high sheet resistance seed layers having a sheet resistance of 50 Ohms/sq or more. This capability is becoming increasingly significant, especially as to copper damascene films, as feature sizes get smaller and smaller. During the plating process, the sheet resistance of the metal film on the wafer changes from a very high initial resistance, for example 50 Ohm/sq or higher, to a much lower sheet resistance of, for example, 0.02 Ohm/sq, as metal is deposited and the metal film thickness increases. Controlling the electric field in the processor as this occurs, to maintain uniform plating, presents engineering challenges.

The curved top surface 124 of the upper cup 76 performs very well for plating onto an initial very thin-seed layer, typically when only the inner anode 70 and the thief assembly 174 are used, and the second anode 72 is substantially off. As the thickness of the plated metal film grows, and the sheet resistance decreases, the second anode 72 is used to help to control the electric field. Slots, such as the slots 90-104 are provided in the upper cup 76 to allow current from the second anode 72 to help control the electric field. However, it has been discovered that the slots may also alter the ideal performance of the curved surface 124 on the thin seed layer, primarily due to current leakage through the second anode 72 current pathways.

Although the second anode current pathways have high resistance, some current from the inner anode 70 still flows through them during plating of the very thin initial seed layer. This changes the electric field in the processor 20, making it less effective at uniformly plating onto the initial seed layer. Specifically, some current from the first anode 70 flows down through inner slots and tubes into the analyte reflow chamber 78, and then up through outer tubes and slots to the edge of the wafer. The result may be that this current leakage causes the current density towards the edge of the wafer to be too high and the current density away from the edge to be too low, for uniform plating.

The current leakage may be reduced by increasing the resistance of the tubes connecting the slots. However, this also increases the cell voltage and the power supply requirements. To control current leakage without increasing the power supply requirements, electrical pathways within the processor may be physically changed via mechanical elements. Specifically the effective length and/or diameter of the tubes may be changed, correspondingly changing the electrical resistance of the flow paths through the tubes. During initial plating, the tubes may be set to maximize resistance, thereby minimizing current leakage through them. After the initial plating, the resistance of the tubes may be reduced to allow passage of more current from the second anode, without placing excessive power requirements on the processor power supply.

Figure 18:
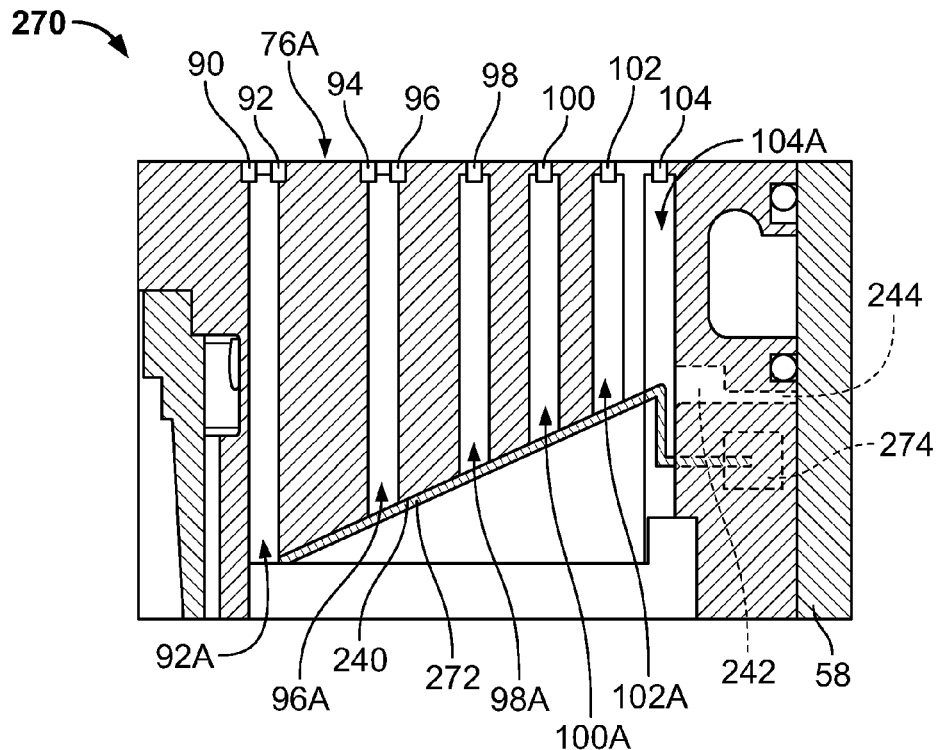
FIG. 18 is a section view of a modification of the design shown in FIG. 8B.

FIG. 18 shows one technique for mechanically changing the resistance of the current path through the tubes. In this technique, a modified upper cup 270 has a truncated cone or conical section plate 272 at the bottom openings of the tubes. The plate 272 has holes or slots aligned with the tubes. A plate actuator 274 is linked to the plate 272 for rotating the plate slightly, from a fully closed position where the plate 272 entirely blocks off the lower ends of the tubes, to a fully open position, where the holes in the plate 272 are fully aligned with the tubes. With this design, some or all of the tubes 92A, 96A, 98A, 100A, 102A and/or 104A may be closed off during initial plating of the thin seed layer. Via control of the plate actuator 274, the tubes may then be opened partially or fully as the sheet resistance of the wafer decreases. The plate 272 may also be designed to allow a different radial current distribution at different rotational positions.

The plate actuator 274 may be a two position actuator, such as a pneumatic actuator, that moves the plate 272 into either a fully open or fully closed position. Alternatively, the plate actuator 274 may be another type of actuator, such as an electrical actuator, that can move the plate 272 continuously, and select any position ranging from fully open to fully closed. The plate actuator 274 may be linked to the plate 272 via a mechanical linkage, or via a magnetic or electromagnetic coupling. Although FIG. 18 shows the plate 272 as a conical section, for processors having flat top surfaces 240 in the analyte reflow chamber 78, a flat plate 272 may be used.

For some applications, the plate may also be set and left at a desired position and not changed during the plating process. For example, if the processor 20 will be processing wafers having a thick seed layer, the plate 272 may be left in the fully open position throughout the plating process.

Figure 19:
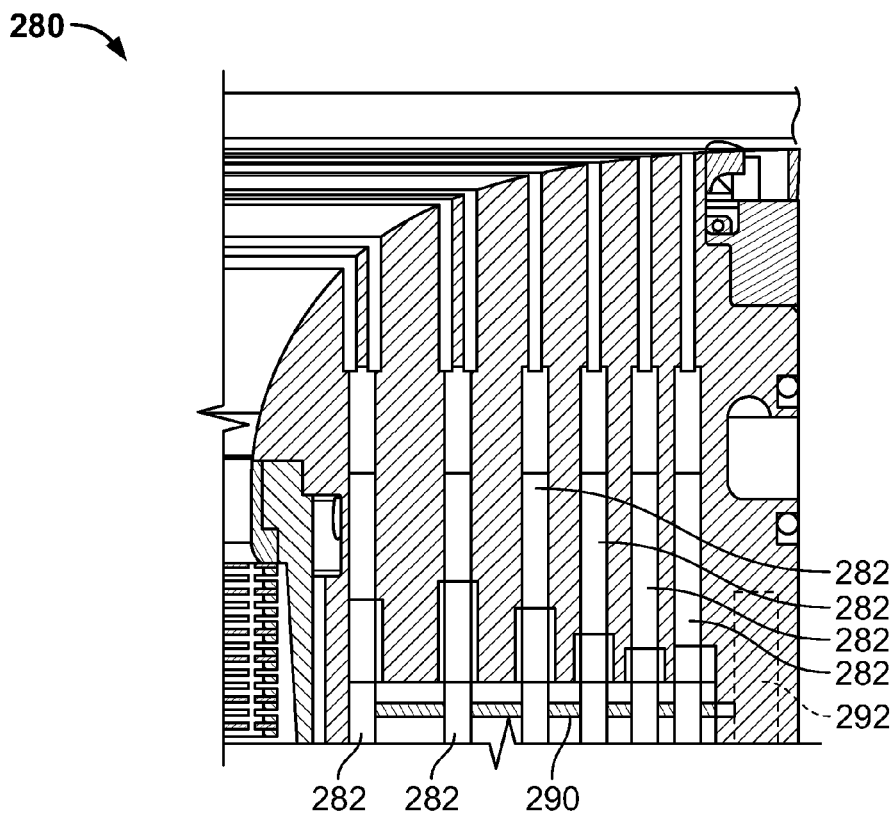
FIG. 19 is a section view of a modification of the design shown in FIG. 6.

FIG. 19 shows another design which allows the resistance of the tubes to be changed. In this design, an upper cup 280 includes tube extensions 282 that can slide or telescope into and out of the tubes 92A, 96A, 98A, 100A, 102A and/or 104A. The tube extensions 282 may be attached to a bridging ring or plate 290. A plate actuator 292 moves the bridging plate 290 up or down, to effectively change the length of the tubes, thereby changing the electrical resistance of the current path through the electrolyte in the tubes. The design and operation of the actuator 292 may be the same as the actuator 274 discussed above. The tube lengths may also be adjusted within each ring using the tube extensions 282, to tune the radial electrical current distribution to the wafer.

FIG. 20 shows another design for changing the effective length and resistance of the tubes using a threaded tube insert 320. An upper segment 322 is attached to a lower segment 324 via screw threads 366. A threaded tube insert 320 may be placed into some or all of the tubes 92A, 96A, 98A, 100A, 102A and/or 104A. Turning the lower segment 324 relative to the upper segment 322 lengthens or shortens the effective length of the tubes. The tube lengths in FIG. 20 may similarly be adjusted to control the radial electrical current distribution to the wafer.

FIGS. 21 and 22 show another processor design 300 with rings 302 designed to fit into one or more of the slots 90, 92, 94, 96, 98, 100, 102 or 104. The rings 302 may be dimensioned so that they may be pressed into the slots. The rings 302 may have through holes 310 aligned over the tubes, with the hole diameters selected to change the effective resistance of the tubes. Some of the hole positions may be omitted or closed with a permanent or temporary plug 312. The hole diameters may all be the same or they may be different. As shown in FIG. 22, the rings 302 may alternatively have posts 306 that extend partially into the tubes, with the diameter of the post less than the tube diameter, to allow for limited current flow through the tube. The rings 302 may be made of an anisotropic material, such as a ceramic having a high density of holes or slots, to reduce current leakage pathways. One example of this design is an alumina plate with a pattern of small diameter parallel through holes.

As shown in FIG. 22, the rings 302, if used, may be placed into the slots from above. Consequently, the rings 302 may be installed and removed without dismantling the processor 20. The rings 302 may be used to partially or fully block flow of electrical current through the slots, to adjust the radial distribution of the electrical current. Rings as shown in FIG. 21 may alternatively be inserted into the lower ends of the tubes 92A-104A. Referring still to FIG. 22, the bottom surfaces of the rings 302 may be flat or angled, and the relative height of each ring, from the bottom surface to the top surface, may vary from slot to slot to help adjust the relative resistance if using an anisotropic material.

The upper cups 76 described above may be made of plastic, ceramic, or other dielectric materials. For processors designed for handling larger size wafers, such as 450 mm diameter, ceramic materials may be used to better stay within dimensional design tolerances. As shown in FIG. 8A, radial branch slots 108 may branch out of a middle area of the inner slot 90 into the surface 124 of the upper cup 76, adjacent to the diffuser 74. The radial branch slots 108 may be interrupted or continuous, with FIG. 8A showing interrupted radial branch slots. Although the surface 124 is described here as a curved surface, it may optionally approximate a curve using multiple incremental steps of the same or varying length, in a stairway type of design.

Thus, novel processing apparatus and methods have been shown and described. Various changes and substitutions may of course be made without departing from the spirit and scope of the invention. The invention, therefore, should not be limited except by the following claims and their equivalents.

The invention claimed is:

1. A processor comprising:
   a vessel;
   a head configured to hold a workpiece, with the head moveable to position the workpiece in the vessel;
   an inner anode associated with an inner anolyte chamber within the vessel;
   an outer anode surrounding the inner anode, the outer anode associated with an outer anolyte chamber;
   an upper cup in the vessel having an upper curved surface, an outer catholyte chamber over the outer anolyte chamber, and an inner catholyte chamber over the inner anolyte chamber;
   a plurality of openings in the upper curved surface of the upper cup;
   a passageway connecting substantially each of the openings to the outer catholyte chamber; and
   an adjusting element associated with the passageways movable between a first position where the passageways are un-occluded to a second position where the passageways are at least partially occluded.

2. The processor of claim 1 wherein the adjusting element comprises a plate having a pattern of through openings in a pattern matching the passageways.

3. The processor of claim 2 wherein the plate is conical.

4. The processor of claim 2 further comprising an actuator attached to the plate for moving the plate between the first and second positions.

5. The processor of claim 1 with the adjusting element in the inner catholyte chamber.

6. A processor comprising:
   a vessel;
   a wafer holder moveable to position a workpiece in the vessel and to make electrical contact with a down facing surface of the wafer;
   an inner anode associated with an inner anode channel within the vessel;
   an outer anode surrounding the inner anode, the outer anode associated with outer anode channel, with the outer anode channel substantially electrically isolated from the inner anode channel by dielectric material walls and seals;
an upper cup in the vessel having an upper curved surface;
a plurality of annular slots in the upper curved surface of the upper cup;
a plurality of passageways connecting substantially each annular slot to an outer catholyte chamber; and
a passageway adjuster associated with at least some of the passageways for adjusting the length of the passageways.

7. The processor of claim 6 with the passageway adjusters comprise tubes extending out of the passageways.

8. The processor of claim 7 with the tubes attached to a ring, and further comprising a ring actuator for changing the positions of the tubes relative to the openings.

9. A processor comprising:
a vessel;
an inner anode associated with an inner electrolyte channel within the vessel;
an outer anode surrounding the inner anode, the outer anode associated with an outer electrolyte channel within the vessel;
an upper cup in the vessel having an upper curved surface;
a plurality of concentric slots in the upper curved surface of the upper cup;
a tube extending substantially from each of the slots to a lower surface of the upper cup; and
a ring insert in one or more of the slots.

10. The processor of claim 9 with the ring comprising an anisotropic material.

11. The processor of claim 9 with the ring having a plurality of openings aligned over the tubes.

12. The processor of claim 9 with the ring having an angled bottom surface.

* * * * *